US007009715B2

(12) United States Patent
Usui et al.

(10) Patent No.: US 7,009,715 B2
(45) Date of Patent: Mar. 7, 2006

(54) METHOD AND APPARATUS FOR DETERMINING ENDPOINT OF SEMICONDUCTOR ELEMENT FABRICATING PROCESS AND METHOD AND APPARATUS FOR PROCESSING MEMBER TO BE PROCESSED

(75) Inventors: Tatehito Usui, Chiyoda (JP); Takashi Fujii, Kudamatsu (JP); Motohiko Yoshigai, Hikari (JP); Tetsunori Kaji, Tokuyama (JP); Hideyuki Yamamoto, Kudamatsu (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/978,412

(22) Filed: Nov. 2, 2004

(65) Prior Publication Data

US 2005/0062982 A1    Mar. 24, 2005

Related U.S. Application Data

(63) Continuation of application No. 09/946,504, filed on Sep. 6, 2001, now Pat. No. 6,903,826.

(51) Int. Cl.
*G01B 9/02* (2006.01)
(52) U.S. Cl. .................................................... 356/504
(58) Field of Classification Search ............... 356/451, 356/503, 504
See application file for complete search history.

(56) References Cited

U.S. PATENT DOCUMENTS

| 4,767,495 | A |   | 8/1988 | Nishioka |
|---|---|---|---|---|
| 5,552,016 | A |   | 9/1996 | Ghanayem |
| 5,648,849 | A |   | 7/1997 | Canteloup et al. |
| 5,658,418 | A |   | 8/1997 | Coronel et al. |
| 5,835,226 | A |   | 11/1998 | Berman et al. |
| 5,928,532 | A | * | 7/1999 | Koshimizu et al. ..... 219/121.42 |
| 6,081,334 | A |   | 6/2000 | Grimbergen et al. |
| 6,207,008 | B1 | * | 3/2001 | Kijima ......................... 216/59 |
| 6,261,470 | B1 |   | 7/2001 | Smith, Jr. et al. |
| 6,297,064 | B1 | * | 10/2001 | Koshimizu ..................... 438/9 |
| 6,306,669 | B1 |   | 10/2001 | Yano et al. |

(Continued)

FOREIGN PATENT DOCUMENTS

EP          1 089 146 A2    4/2001

(Continued)

OTHER PUBLICATIONS

Lide, "The Idenrifiction of Molecular Spectra," *CRC Handbook of Chemistry and Physics*, CRC Press, John Wiley & Sons, Inc., 1976.

(Continued)

*Primary Examiner*—Zandra V. Smith
*Assistant Examiner*—Michael A. Lyons
(74) *Attorney, Agent, or Firm*—Antonelli, Terry, Stout and Kraus, LLP.

(57) ABSTRACT

Standard patterns of differential values of interference light that correspond to a predetermined step height of the first material being processed and standard patterns of differential values of interference light that correspond to a predetermined remaining mask layer thickness of the material are set. These standard patterns use wavelengths as parameters. Then, the intensities of interference light of multiple wavelengths are measured for a second material that has the same structure as the first material. Actual patterns with wavelength as parameter are determined from differential values of the measured interference light intensities. Based on the standard patterns and the actual patterns of the differential values, the step height and the remaining mask layer thickness of the second material are determined.

21 Claims, 15 Drawing Sheets

U.S. PATENT DOCUMENTS

| | | |
|---|---|---|
| 6,383,402 B1 | 5/2002 | Smith, Jr. et al. |
| 6,414,499 B1 | 7/2002 | Yang et al. |
| 6,815,228 B1 * | 11/2004 | Usui et al. .................... 438/14 |
| 2001/0016053 A1 | 8/2001 | Dickson et al. |
| 2002/0009814 A1 | 1/2002 | Usui et al. |
| 2002/0029851 A1 | 3/2002 | Edamura et al. |
| 2002/0029854 A1 | 3/2002 | Schertler |
| 2003/0043383 A1 * | 3/2003 | Usui et al. .................. 356/504 |
| 2003/0085198 A1 | 5/2003 | Yi et al. |

FOREIGN PATENT DOCUMENTS

| | | |
|---|---|---|
| JP | 61-053728 | 3/1986 |
| JP | 61-53728 | 3/1986 |
| JP | 63-200533 | 8/1988 |
| JP | 64-068932 | 3/1989 |
| JP | 05-179467 | 7/1993 |
| JP | 06-084849 | 3/1994 |
| JP | 8-274082 | 10/1996 |
| JP | 08-274082 | 10/1996 |
| JP | 2000-097648 | 4/2000 |
| JP | 2000-106356 | 4/2000 |
| JP | 2000-228397 | 8/2000 |
| JP | 2000-324297 | 11/2000 |

OTHER PUBLICATIONS

Sasaki et al., "Estimateion of Component Spectral Curves from Unknown Mixture Spectra," *App. Opt.*, vol. 23, pp. 1955-1959 (1984).

* cited by examiner

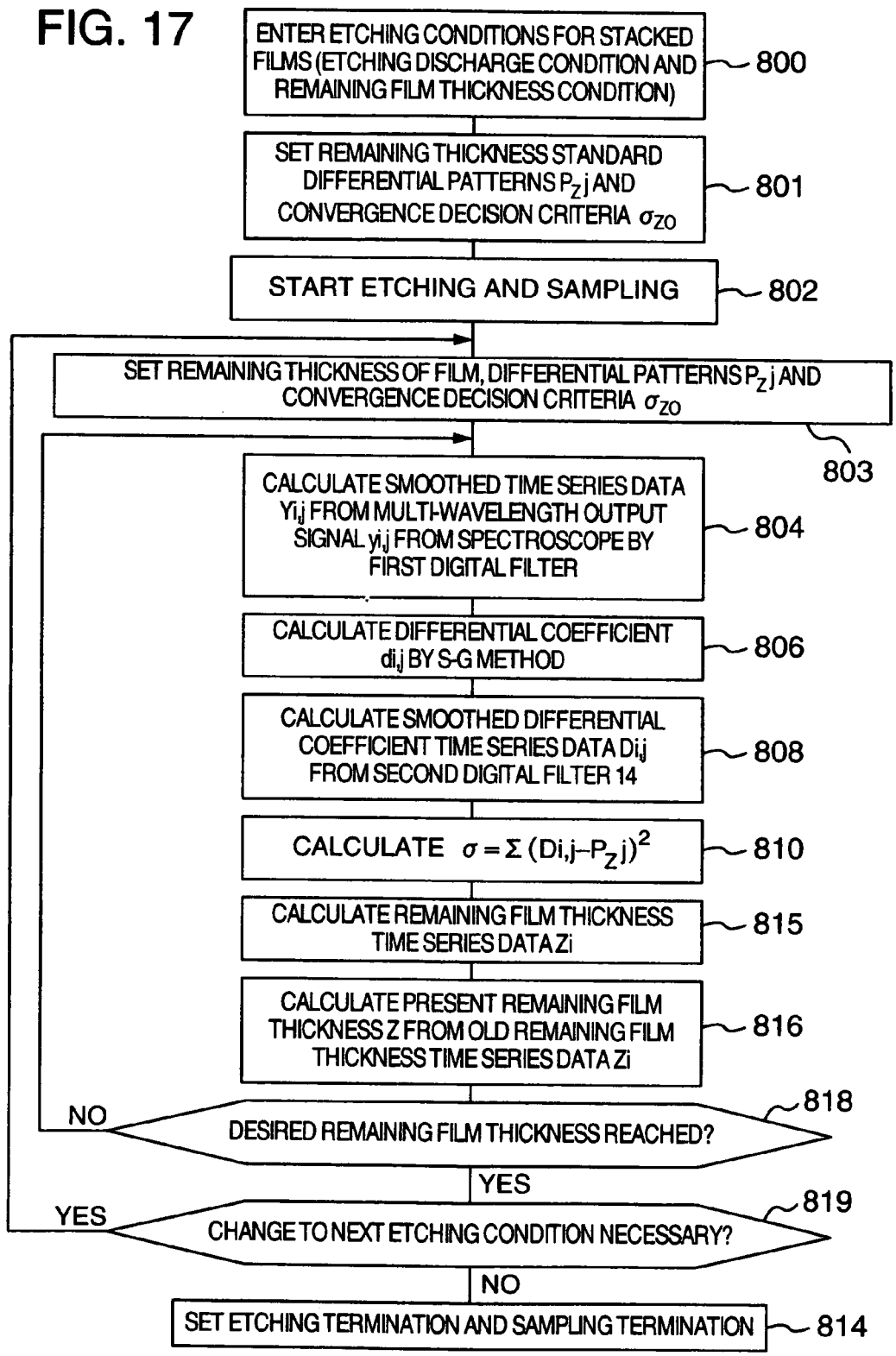

METHOD AND APPARATUS FOR DETERMINING ENDPOINT OF SEMICONDUCTOR ELEMENT FABRICATING PROCESS AND METHOD AND APPARATUS FOR PROCESSING MEMBER TO BE PROCESSED

CROSS-REFERENCE TO RELATED APPLICATIONS

This is a continuation of application Ser. No. 09/946,504 filed 6 Sep. 2001 now U.S. Pat. No. 6,903,826, allowed, and is related to Application No. 09/793,624 filed 27 Feb. 2001, the contents of both of which are incorporated herein by reference in their entirety.

BACKGROUND OF THE INVENTION

The present invention relates to a method and apparatus which processes a material by using a method and apparatus for determining an endpoint of a semiconductor device manufacturing process. More specifically, the present invention relates to a method and apparatus for determining an endpoint of semiconductor device manufacturing process and a method and apparatus for processing a material by using the endpoint determining method and apparatus, which detects an etch quantity of, or deposition on, a material being processed in a semiconductor integrated circuit manufacturing process. More specifically, the present invention relates to a method and apparatus for measuring an etch depth and a thickness of a material being processed and a method and apparatus for processing a material by using the etch depth/thickness measuring method and apparatus, which can precisely measure etch quantity of each of various layers formed over a substrate during an etching process using plasma discharge and thereby realize a desired etch depth and thickness of each layer.

In the manufacture of semiconductor wafers, dry etching has been in wide use in etching layers of various materials, particularly dielectrics, and in forming patterns over the wafer surface. What is most important in controlling process parameters is to accurately determine an etching endpoint during the processing of these layers at which desired etched depth and film thickness are reached and the etching is stopped.

During the dry etching of a semiconductor wafer, the intensity of light of a specific wavelength in a plasma beam changes as the etching of a particular film proceeds. An example method currently available for determining an endpoint of the semiconductor wafer etching process involves detecting a change in the intensity of light of a particular wavelength emitted from a plasma during the dry etching and, based on the result of detection, determining an etching process endpoint for a particular film. In this case, it is necessary to prevent an erroneous detection caused by noise-induced variations of a detected waveform. Methods for detecting light intensity variations with high precision includes those described in Japanese Patent Unexamined Publication Nos. 61-53728 and 63-200533. Noise reduction is achieved by a moving average method described in Japanese Patent Unexamined Publication No. 61-53728 and by approximation processing using a first-order least squares method described in Japanese Patent Unexamined Publication No. 63-200533.

As semiconductors are fabricated in increasingly microfine structures and in higher circuit densities in recent years, an open area ratio (an area of a semiconductor wafer to be etched with respect to its overall area) decreases, weakening the intensity of light of a specific wavelength from a reactive product that is taken into an photodetector from an optical sensor. As a result, a level of signal sampled from the photodetector becomes small, making it difficult for an endpoint determining unit to determine the etching process endpoint reliably based on the sampled signal from the photodetector.

In stopping the etching process after detecting the etching process endpoint, it is important that the remaining thickness of a dielectric layer be equal to a predetermined value. The conventional techniques monitor an overall process by using a time-thickness control method which assumes that the etch rate in each layer is constant. The etch rate is determined in advance as by processing a sample wafer. This approach uses a time monitor technique and stops the etching process when a length of time corresponding to a predetermined film thickness to be etched has elapsed.

An actual layer, for example, an $SiO_2$ layer formed by the LPCVD (low pressure chemical vapor deposition) technique, however, is known to have a low reproducibility in terms of thickness. An allowable error of thickness due to LPCVD process variations is equal to about 10% of an initial thickness of the $SiO_2$ layer. Hence, the time monitor technique cannot precisely measure the actual final thickness of the $SiO_2$ layer remaining on a silicon substrate. The actual thickness of the remaining layer is measured at a final step by a technique using a standard spectroscopic interferometer. When it is decided that the wafer is overetched, the wafer is discarded as a faulty product.

It is also known that the insulating film etching apparatus has performance variations with elapse of time, such as the etch rate falling as the etching operation is repeated. In some cases the etching may inadvertently stop while in process. These problems need to be solved. In addition, it is important to monitor etch rate variations over time in assuring a stable execution of the process. The conventional method, however, monitors only the time in determining the etching process endpoint and does not provide an appropriate means of dealing with variations over time of the etch rate. When the duration of etching is as short as about 10 seconds, the endpoint determining method must reduce a decision preparation time and the decision interval be made short enough. These requirements are not met satisfactorily. Another problem is that an etched area of the insulating film is in many cases less than 1%, which means that a change in intensity of plasma-induced light emitted from a reactive product created during etching is small. Hence an endpoint determining system capable of detecting even very small changes is required, but no practical and inexpensive systems with such a capability are available.

Among other etching process endpoint determining methods for semiconductor wafers are those using an interferometer which are disclosed in Japanese Patent Unexamined Publication Nos. 5-179467, 8-274082, 2000-97648 and 2000-106356. These methods using an interferometer apply a monochromatic radiation from a laser at an orthogonal incidence angle to a wafer that includes a stacking structure of different materials. In a structure in which an $SiO_2$ layer is stacked over an $Si_3N_4$ layer, for example, the radiated light reflected by the upper surface of the $SiO_2$ layer and the radiated light reflected by a boundary surface formed between the $SiO_2$ layer and the $Si_3N_4$ layer combine to form interference fringes. The reflected light is radiated onto an appropriate detector which generates a signal whose magnitude changes according to the thickness of the $SiO_2$ layer being etched. During the etching process, as soon as the upper surface of the $SiO_2$ layer is exposed, it becomes possible to monitor continuously and precisely the etch rate and the present thickness of the layer being etched. Another method is also known which uses a plasma, rather than a laser, to emit predetermined light which is measured by a spectrometer.

SUMMARY OF THE INVENTION

The contents of the literatures cited above may be summarized as follows.

In Japanese Patent Unexamined Publication No. 5-179467, three color filters, red, green and blue, are used to detect interference light (plasma light) to determine an endpoint of the etching process.

In Japanese Patent Unexamined Publication No. 8-274082 (U.S. Pat. No. 5,658,418), a change over time of an interference waveform made up of two wavelengths and its differential waveform are used to count extremal values of interference waveform (maximum and minimum of waveform: zero-cross point of differential waveform). By measuring the time it takes for the count value to reach a predetermined value, an etch rate is calculated. Based on the calculated etch rate, a remaining etch time required to reach a predetermined film thickness is determined and the etching process is stopped accordingly.

Japanese Patent Unexamined Publication No. 2000-97648 determines a waveform of difference (with wavelength as parameter) between an interference light intensity pattern (with wavelength as parameter) before the process and an interference light intensity pattern (with wavelength as parameter) after or while in the process; and compares the difference waveform with difference waveforms stored in database to determine a step height (film thickness).

Japanese Patent Unexamined Publication No. 2000-106356 relates to a rotary film application apparatus and measures a change over time of interference light of multiple waveforms to determine a film thickness.

U.S. Pat. No. 6,081,334 measures characteristic behaviors in a change over time of interference light and stores them in database, and compares the measured interference waveform with the database to determine the endpoint of the etching process. With the endpoint determined, an operator is then prompted to change an etching process condition.

These known methods have the following problems.

(1) In the etching process using a mask layer (e.g., resist, nitride film and oxide film), interference light from the mask layer is superimposed on interference light from the object material being etched.

(2) In the etching of the material to be processed (e.g., silicon substrate and mask layer formed over the silicon substrate), because the mask layer as well as silicon substrate is etched, simply measuring the etch amount of the material (etch depth) may not be able to correctly measure the etch amount of the silicon substrate.

(3) Wafers for a mass production process have distribution variations, due to device structures, in the initial thickness of the mask layer and in the initial thickness of the material to be etched so that interference light from differing film thicknesses may be superimposed on the target interference light.

For the reasons cited above, it is difficult to correctly measure and control with a required precision the etch depth and remaining thickness of a film being processed (layer to be processed in the semiconductor manufacture), particularly in the plasma etching.

It is an object of the present invention to provide a method and apparatus for determining an endpoint of semiconductor device manufacturing process and a method and apparatus for processing a material by using the endpoint determining method and apparatus, which can solve the above-described problems experienced with the conventional techniques,.

Another object of the present invention is to provide a method and apparatus for determining an endpoint of semiconductor device manufacturing process and a method and apparatus for processing a material by using the endpoint determining method and apparatus, which can precisely measure online the actual etch depth and remaining thickness of a layer being processed in plasma processing, particularly in plasma etching, and thereby determine an endpoint of the process.

Still another object of the present invention is to provide an etching process which can control online the etch depth and thickness of each layer in semiconductor devices to desired values with high precision.

A further object of the present invention is to provide an apparatus that can precisely measure online the actual etch depth and thickness of a layer being processed.

To solve the problems experienced with the conventional techniques and achieve the above objectives, the inventors of this invention propose a method that determines time-differential waveforms of interference light produced by interference between a plurality of wavelengths and, based on the time-differential waveforms, determines patterns representing wavelength dependencies of the interference waveform differential values (i.e., patterns of differential values of interference waveforms using wavelength as parameter), and measures the film thickness by using these patterns.

The reasons for using the patterns representing the wavelength dependencies of the time-differential values of interference waveforms in this invention are as follows.

Because the measurement assumes the in-situ (realtime) measuring during the etching, the thickness of a layer being processed are constantly changing. Hence, the interference waveforms can be time-differentiated. Further, this differentiation can remove noise from the interference waveforms.

Further, the refractive indices of the materials to be etched (e.g., silicon substrate and mask layer nitride film) are different with respect to the wavelength. Therefore, by measuring the interference light of multiple wavelengths, it is possible to detect characteristic changes (dependent on film thickness) of individual substances.

According to one aspect, the present invention provides a method of measuring an etch depth and a thickness of a material being processed, comprising:

a) a step of setting standard patterns of differential values of interference light from a first material to be processed that correspond to a predetermined etch quantity of the first material including a mask layer, the standard patterns using the wavelength as a parameter;

b) a step of setting standard patterns of differential values of interference light from the mask layer of the first material that correspond to a predetermined etch quantity of the mask layer, the standard patterns using the wavelength as a parameter;

c) a step of measuring intensities of interference light of multiple wavelengths from a second material being processed of the same structure as the first material and determining actual patterns of differential values of the measured interference light intensities, the actual patterns using the wavelength as a parameter; and d) a step of determining an etch quantity of the second material based on the standard patterns of the first material, the standard patterns of the mask layer, and the actual patterns.

This invention therefore can provide a method of measuring an etch depth and a thickness of a material being processed and a method of processing a sample of the material by using the etch depth/thickness measuring method, which can precisely measure online the actual etch quantity in plasma processing, especially plasma etching.

Further, it is also possible to provide an etching process that can control online the etch quantity of each layer of semiconductor devices to a desired value with high precision. It is also possible to provide an etch depth and thickness measuring apparatus that can precisely measure online the actual etch quantity of a layer being processed.

BRIEF DESCRIPTION OF THE DRAWINGS

FIG. 17 is a flow chart showing an operation of the embodiment of FIG. 15.

DETAILED DESCRIPTION OF THE EMBODIMENTS

Figure 1:
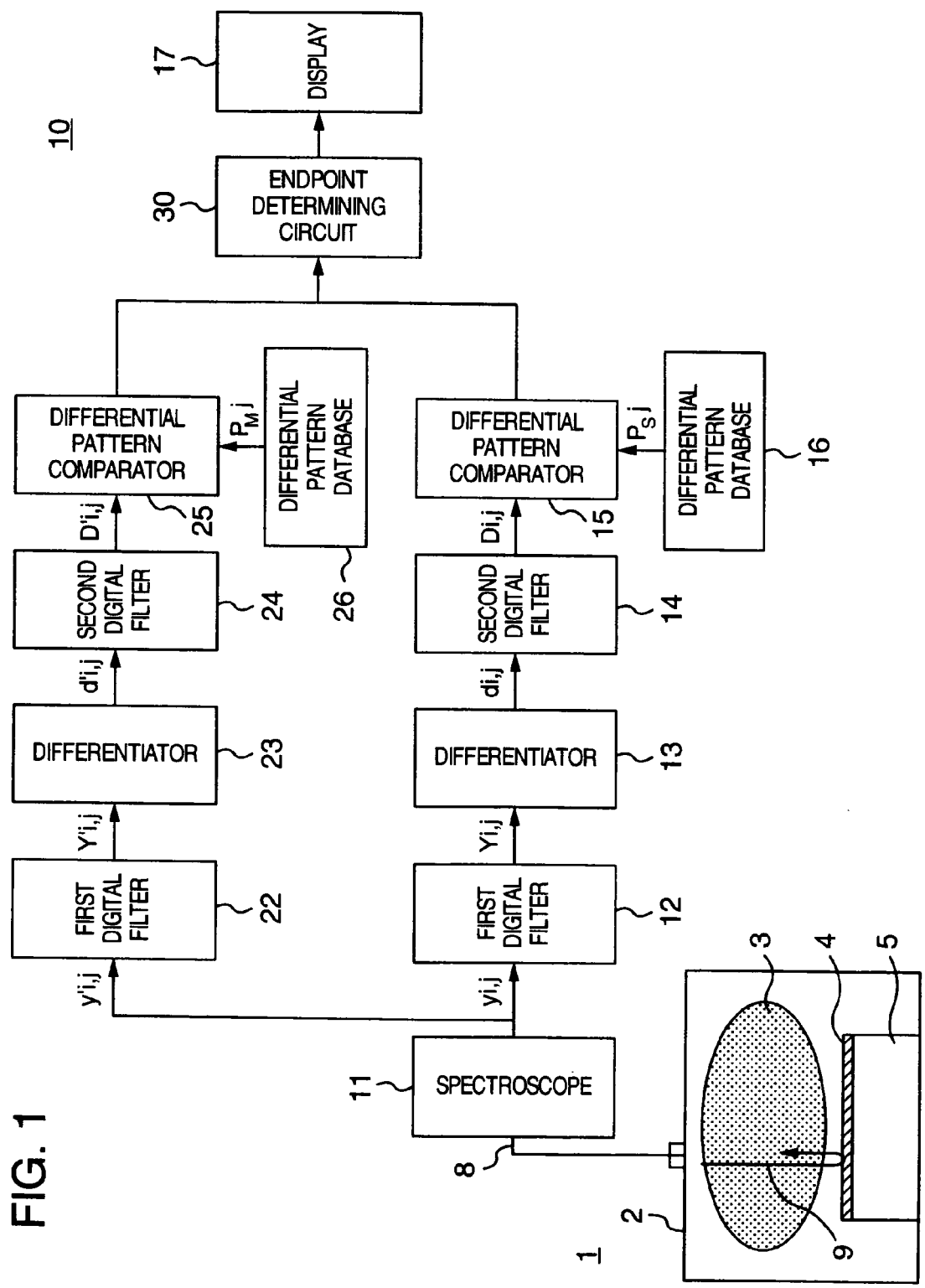
FIG. 1 is a block diagram showing an overall configuration of a semiconductor wafer etching apparatus having an etch quantity measuring apparatus according to a first embodiment of the present invention.

Embodiments of the present invention will be described. In the following embodiments, constitutional members with similar functions to those of the first embodiment carry like reference numbers and their detailed descriptions are omitted. As the endpoint determining method used in the semiconductor device manufacturing process according to the present invention, we will describe a method of measuring an etch quantity (etched depth and film thickness) in a wafer etching process. It should be noted that the present invention is not limited to this method and can also be applied to a method of measuring an amount of deposition (deposited film thickness) or the like in such film deposition processes as plasma CVD and sputtering.

Now, a first embodiment of the present invention will be described by referring to FIG. 1 to FIG. 4.

In this embodiment, when plasma etching is to be performed on a material to be processed such as a semiconductor wafer, standard patterns $P_S$ and $P_M$ are set which represent wavelength dependencies of differential values of interference light intensities as related to the etch quantities of a sample material (sample wafer) and of a mask layer on the wafer (with wavelength taken as parameter). Next, for an actual wafer with the same structure as the sample wafer, measurements are taken of intensities of interference light at a plurality of wavelengths used in the actual processing to determine actual patterns representing wavelength dependencies of differential values of the measured interference light intensities (with wavelength taken as parameter). The standard patterns and the actual patterns of the light intensity differential values are compared to determine an etch quantity (endpoint of the process) for the actual wafer.

First, with reference to FIG. 1, an overall configuration of the semiconductor wafer etching apparatus having an etch quantity (etched depth in actual wafer and film thickness) measuring apparatus according to the present invention will be explained. An etching apparatus 1 has a vacuum chamber 2 into which is introduced an etching gas which is decomposed by a microwave power to create a plasma 3 which in turn etches a material 4 such as a semiconductor wafer placed on a sample table 5. A measuring light source (e.g., halogen light source) of a spectroscope 11 of an etch quantity (e.g., etched depth and film thickness) measuring apparatus 10 radiates light of multiple wavelengths, which is guided through an optical fiber 8 into the vacuum chamber 2 and applied to the wafer 4 at an orthogonal incidence angle. The wafer 4, as shown in FIG. 2A, has a silicon 40 as a material to be etched and a nitride film 41 as a mask layer. The radiated light is reflected by the mask layer as indicated by 9A and by the silicon surface clear of the mask layer as indicated by 9B, and these reflected rays of light form interference light. That is, the interference light is an interference component generated by the step height between the mask layer and the silicon. The reflected light 9A from the mask layer comprises light 9a reflected by the surface of the nitride film and light 9b reflected by a boundary surface between the nitride film and the silicon. These reflected light also forms interference light. That is, this interference light is an interference component produced by a reduction in the mask layer thickness. The interference light is introduced through the optical fiber 8 into the spectroscope 11 of the etch quantity measuring apparatus 10 which, based on the received interference light, measures the etched silicon depth and the mask layer thickness and determines an endpoint of the process (i.e., end of etching).

The etch quantity measuring apparatus 10 has a spectroscope 11, first digital filter circuits 12, 22, differentiators 13, 23, second digital filter circuits 14, 24, differential waveform pattern databases 16, 26, differential pattern comparators 15, 25, an endpoint determining circuit 30 for determining an endpoint of the etching process according to the results of these comparators, and a display 17 for displaying a result of decision made by the endpoint determining circuit 30.

Figure 2A:
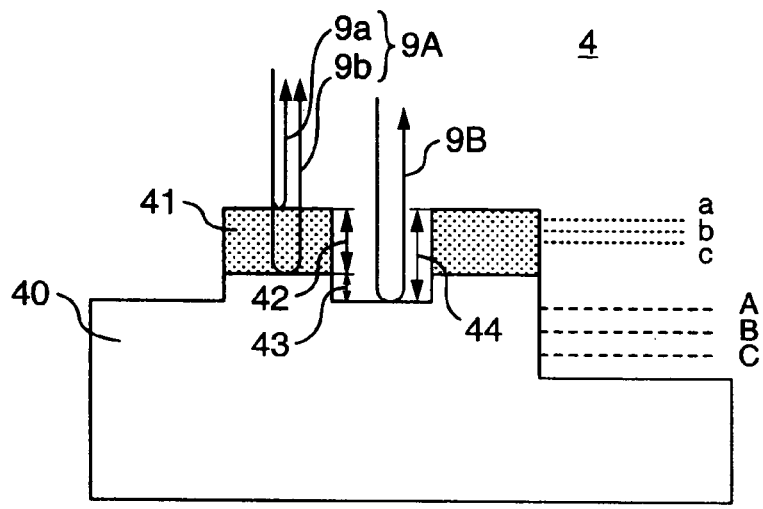
FIG. 2A is a vertical cross section of a wafer being etched.

FIG. 1 shows a functional configuration of the etch quantity measuring apparatus 10, and the actual configuration of the etch quantity measuring apparatus 10 excluding the display 17 and the spectroscope 11 may be comprised of a CPU, storage devices such as ROM for storing an etched depth and film thickness measuring program and various data including interference light differential waveform pattern database, RAM for storing measured data and external storage devices, a data input/output device, and a communication control device. This can also be applied to other embodiments, such as one shown in FIG. 1.

The intensities of light of multiple wavelengths from the wafer that are received by the spectroscope 11 are detected as current signals corresponding to the light intensities and transformed into voltage signals. Signals representing a plurality of particular wavelengths output as sampling signals from the spectroscope 11 are stored as time series data yij, y'ij in a storage device such as RAM not shown. First and second wavelength bands of the time series data yij, y'ij are smoothed by the first digital filter circuits 12, 22 and stored as smoothed time series data Yij, Y'ij in a storage device such as RAM. Based on the smoothed time series data Yij, Y'ij, the differentiators 13, 23 calculate time series data dij, d'ij of differential coefficient values (first differential value or second differential value) which are stored in a storage device such as RAM. The time series data dij, d'ij of differential coefficient values are smoothed by the second digital filter circuits 14, 24 and stored as smoothed differential coefficient time series data Dij, D'ij in a storage device such as RAM. From the smoothed differential coefficient time series data Dij, D'ij are determined actual patterns representing the waveform dependencies of differential values of the interference light intensities (with the wavelength taken as parameter).

To obtain different actual patterns for the first and second wavelength bands, the apparatus of FIG. 1 is configured as follows. When the first and second wavelength bands are equal, the differential coefficients of the first digital filter circuits 12, 22 are set to different values. In that case, the values of the differentiators 13, 23 may be set to equal or different values and the differential coefficients of the second digital filter circuits 14, 24 set to equal or different values. When the first and second wavelength bands are different, the differential coefficients of the first digital filter circuits 12, 22 are set to equal or different values and the values of the differentiators 13, 23 set to equal or different values. The differential coefficients of the second digital filter circuits 14, 24 may also be set to equal or different values.

In the configuration of FIG. 1, the circuit comprising the first digital filter circuit, the differentiator, the second digital filter circuit, the differential waveform pattern database and the differential pattern comparator is provided for each of the first and second waveform bands. Instead of this configuration, one such circuit may be provided commonly for both the first and second wavelength bands, and the differential coefficients and others may be switched at predetermined time intervals to produce the actual pattern alternately for the first wavelength band and for the second wavelength band.

The differential waveform pattern database 16 is preset with a differential waveform pattern data value $P_{Sj}$ of interference light intensity for the first wavelength band that corresponds to the step height between the silicon and the mask layer, the silicon being an object to be checked for the etch quantity. The differential waveform pattern database 26 is preset with a differential waveform pattern data value $P_{Mj}$ of interference light intensity for the second wavelength band that corresponds to the thickness of the mask layer on the silicon wafer. The differential pattern comparator 15 compares the actual pattern corresponding to the step height with the differential waveform pattern data value $P_{Sj}$ to determine the step height (depth from the surface of the mask layer to the bottom of a groove etched in the silicon wafer). The differential pattern comparator 25 compares the actual pattern corresponding to the mask layer thickness with the differential waveform pattern data value $P_{Mj}$ to determine the thickness of the mask layer (remaining film thickness). As a result, the etch quantity of the material being etched, i.e., etched depth, is determined and displayed on the display 17.

Although this and the following embodiments show configurations with only one spectroscope 11, a plurality of spectroscopes 11 may be provided when it is desired to measure and control a wider area of the wafer.

Figure 2B:
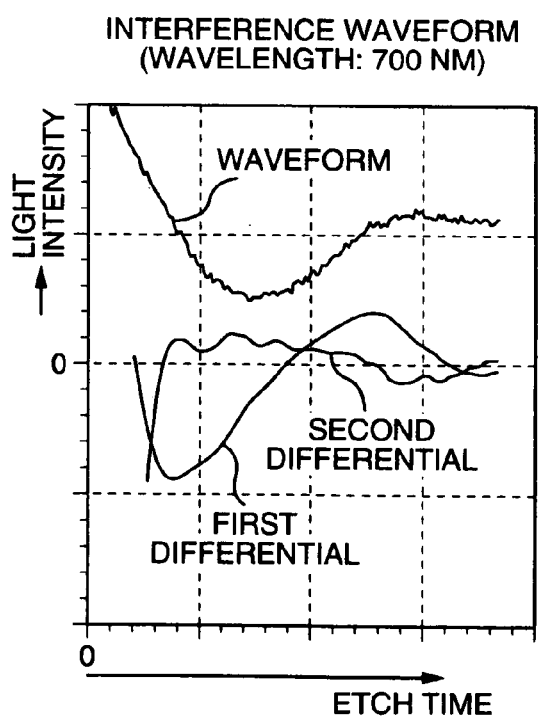
FIGS. 2B and 2C are diagrams showing examples of actual waveforms of interference light with different wavelengths.
Figure 2C:
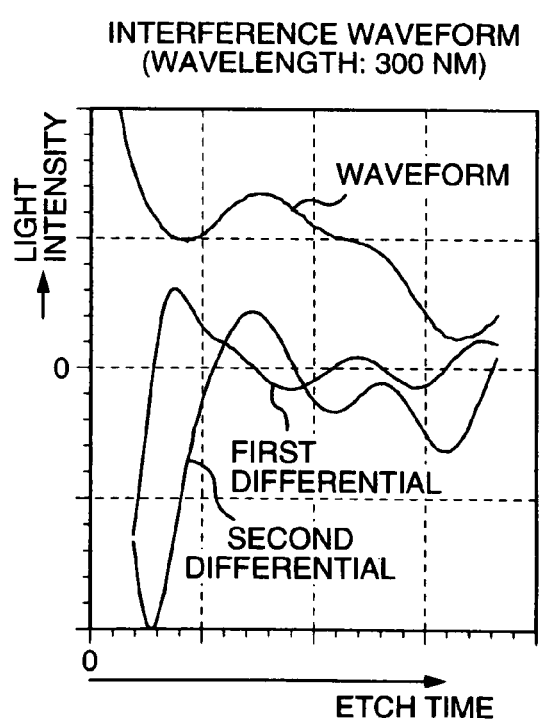

FIG. 2A illustrates a vertical cross section of the silicon wafer 4 while in the etching process, and FIG. 2B and FIG. 2C show actual patterns of interference light waveform. In FIG. 2A the mask layer 41 is formed over the silicon substrate 40. In this etching process, the silicon substrate is a material to be etched and this type of processing is called an STI (Shallow Trench Isolation) etching to isolate devices.

The light of multiple wavelengths emitted from the spectroscope 11 is radiated at an orthogonal incident angle onto the wafer 4, which includes a stacked structure of a material to be etched and a mask layer. The light 9 applied to the mask layer 41 is reflected by the upper surface of the mask layer 41 as indicated by 9a and also reflected by a boundary surface between the mask layer 41 and the silicon substrate 40 as indicated by 9b. These reflected rays of light combine to form interference light. The light 9 introduced to an area that is clear of the mask layer 41 and etched is reflected by the upper surface of the silicon substrate 40 as indicated by 9B. This reflected light 9B interferes with light 9A (comprised of 9a and 9b) reflected by the mask layer 41 to form interference light. The positions at which the rays of light 9B and 9a are reflected change to A(a), B(b) and C(c) as the etching process proceeds. The reflected rays of light are introduced into the spectroscope 11 which generates a signal whose magnitude changes according to the thicknesses of the silicon substrate 40 being etched and the mask layer.

As shown in FIG. 2B, the waveform of interference light in the long wavelength range (second wavelength band: 700 nm for example) slowly changes as the etching process proceeds. The waveform of interference light in the short wavelength range (first wavelength band: 300 nm for example) has a long-cycle wave and a short-cycle wave superimposed and changes accordingly, as shown in FIG. 2C. This is because the interference light in the long wavelength range represents a change in the interference component caused by a reduction in the mask layer thickness (a, b, c surfaces of FIG. 2A) while the interference light in the short wavelength range represents a change in the interference component caused by the step height 44 between the silicon substrate to be etched and the mask layer (depth difference between the mask layer surface a, b, c and etched silicon substrate surface A, B, C). Based on the smoothed time series data Yij, Y'ij of the interference light of these multiple wavelengths, calculations are performed to produce differential coefficient time series data dij, j'ij of first differential value or second differential value. FIG. 2B shows the first differential value and second differential value of the interference light with a wavelength of 700 nm and FIG. 2C shows the first differential value and second differential value of the interference light with a wavelength of 300 nm.

As can be seen from FIG. 2B and FIG. 2C, this differentiation processing clearly distinguishes the change in the interference component due to a reduction in the mask layer thickness from the change in the interference component due to the step height between the silicon substrate and the mask layer. This is because the refractive index of the material being etched (e.g., refractive indices of silicon and nitride film-or mask layer and refractive index of vacuum space in the grooved portion) differs depending on the wavelength. The present invention focuses on this fact and is characterized in that it determines the step height 44 between the silicon substrate and the mask layer from the interference light in the short wavelength range and accurately measures the reduction in the mask layer thickness (remaining thickness of the mask layer 41) from the interference light in the long wavelength range.

Figure 3A:
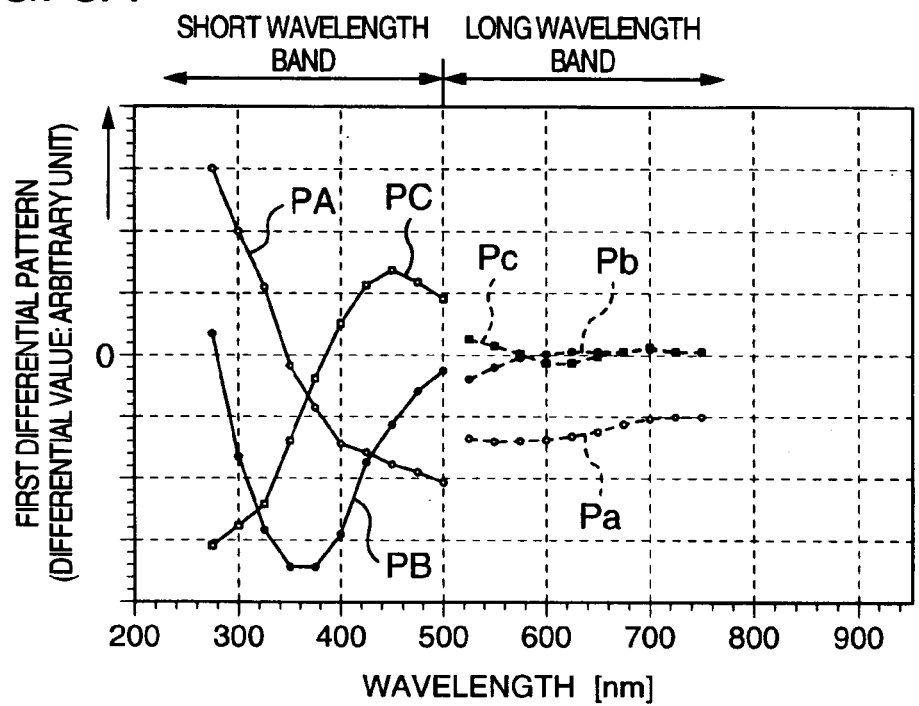
FIGS. 3A and 3B are diagrams showing differential coefficient time series data of interference light corresponding to a step height (distance from the mask surface a, b, c to the etched surface of silicon wafer A, B, C) and remaining film thickness of the mask surface a, b, c in FIGS. 2A, 2B, with wavelength taken as parameter.
Figure 3B:
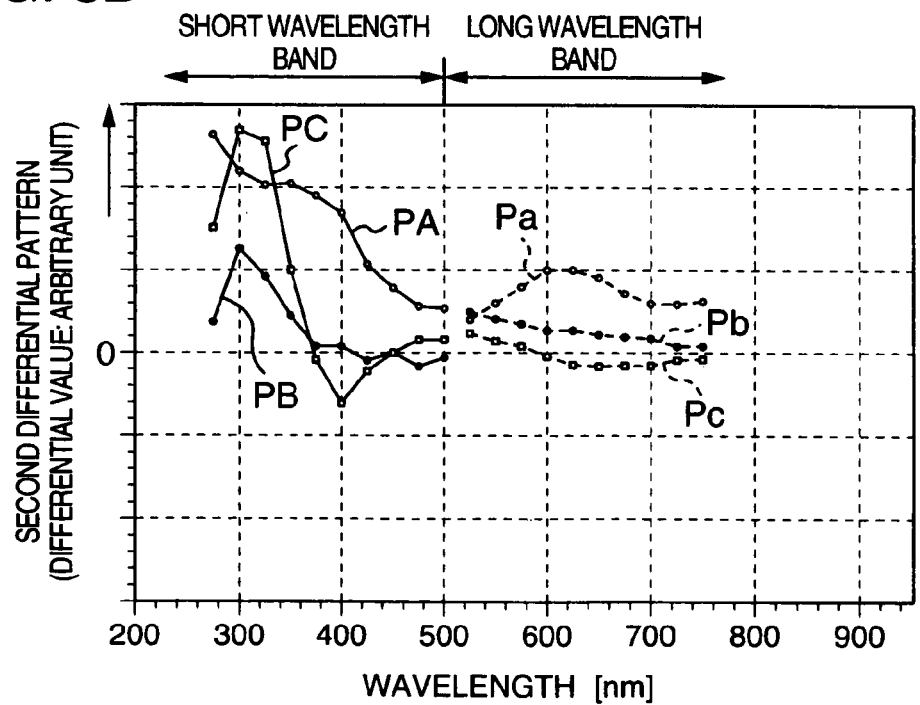

FIG. 3A shows pattern data of first differential waveform of the interference light and FIG. 3B shows pattern data of second differential waveform of the interference light.

PA, PB and PC in FIG. 3A and FIG. 3B represent differential waveform pattern data for etch quantities A (step height 44=300 nm), B (step height=400 nm), C (step height=500 nm) of FIG. 2A. Similarly, Pa, Pb and Pc in FIG. 3A and FIG. 3B represent differential waveform pattern data for etch quantities a (remaining mask layer thickness 42=95 nm), b (remaining mask layer thickness=65 nm), c (remaining mask layer thickness=35 nm) of FIG. 2A. The etched depth 43 in the silicon substrate is 205 nm for the position A of FIG. 2A, 335 nm for position B and 465 nm for position C.

As can be seen from FIG. 3A and FIG. 3B, the first differential waveform pattern and second differential waveform pattern of the interference light are characteristic of each etch quantity of the material being etched. These patterns change from one material to another, so experiments are conducted in advance to obtain data for a variety of materials and a range of etch quantity used in the process and to store in storage devices (16, 26) first differential waveform pattern and second differential waveform pattern as the standard patterns.

Figure 4:
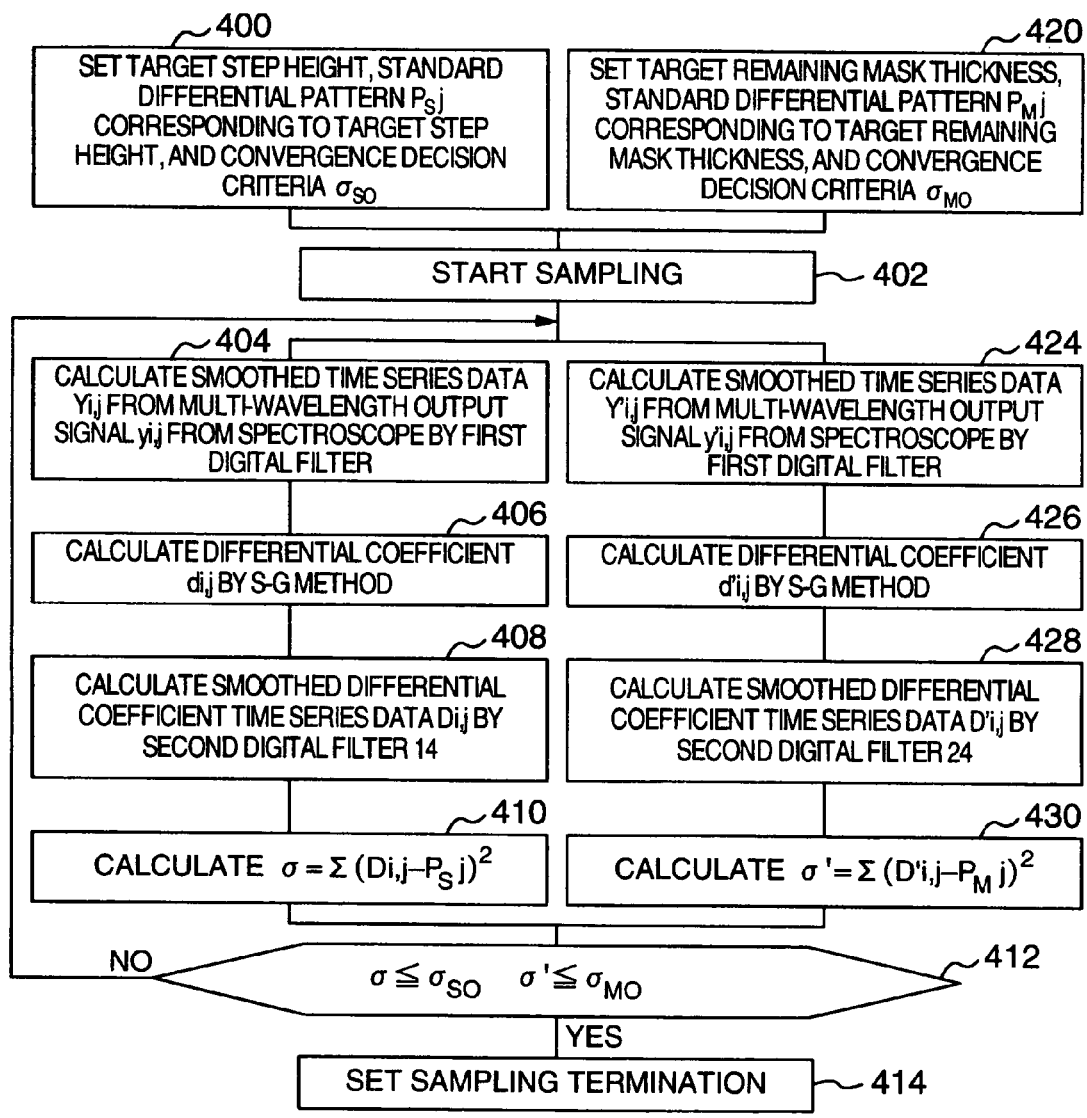
FIG. 4 is a flow chart showing a procedure for determining the step height in the wafer being processed and the remaining film thickness during the etching process performed by the etch quantity measuring apparatus.

Next, by referring to the flow chart of FIG. 4, we will explain a procedure for determining the etch quantity of the material being etched by the etch quantity measuring apparatus 10.

First, a target etch quantity (i.e., a target step height and a target remaining mask layer thickness) is set, and the differential patterns $P_Sj$, $P_{Mj}$ corresponding to the target step height and the target remaining mask layer thickness and decision criteria $\sigma_{SO}$, $\sigma_{MO}$ are also set (step 400 and 420). That is, from the differential value standard patterns PA, PB, PC for a plurality of wavelengths as shown in FIG. 3A and FIG. 3B that are stored in advance in the differential waveform pattern database 16, one differential pattern corresponding to the target step height is set. Similarly, from the differential value standard patterns Pa, Pb, Pc for a plurality of wavelengths as shown in FIG. 3A and FIG. 3B that are stored in advance in the differential waveform pattern database 26, one differential pattern corresponding to the target remaining mask layer thickness is set.

In the next step, sampling of the interference light (every 0.25–0.4 second) is started (step 402). That is, when the etching process starts, a sampling start command is issued. The intensities of emitted light of multiple wavelengths that change during the etching process are detected by the photodetector of the spectroscope 11 as the light detection signals of voltage representing the light intensities. The light detection signals of the spectroscope 11 are converted into digital signals which are the sampling signals yi,j, y'i,j.

Next, the multi-wavelength output signals yi,j, y'i,j from the spectroscope 11 are filtered by the first digital filters 12, 22 to calculate time series data Yi,j, Y'i,j (steps 404, 424).

Next, the differentiators 13, 23 calculate the differential coefficients di,j, d'i,j by the S-G method (Savitzky-Golay method) (steps 406, 426). That is, the differentiation processing (S-G method) determines a coefficient (first or second order) di of the signal waveform. Further, the second digital filters 14, 24 smooth the coefficient to obtain differential coefficient time series data Di,j, D'i,j (steps 408, 428). Then, the differential pattern comparator 15 calculates a value of $\sigma = \Sigma(D_{i,j} - P_{Sj})^2$ for the step height (step 410). Likewise, the differential pattern comparator 25 calculates a value of $\sigma' = \Sigma(D'_{i,j} - P_{Mj})^2$ for the reduction in the mask layer thickness (or remaining mask layer thickness) (step 430). Further, the endpoint determining circuit 30 checks the relations of $\sigma \leq \sigma_{SO}$ and $\sigma' \leq \sigma_{MO}$ (step 412). When the relations of $\sigma \leq \sigma_{SO}$ and $\sigma' \leq \sigma_{MO}$ hold, it is decided that the step height and the remaining mask layer thickness reach their respective predetermined values and the etching process termination step is initiated. At the same time, the result of this step is displayed on the display 17. When any of the relations $\sigma \leq \sigma_{SO}$ and $\sigma' \leq \sigma_{MO}$ fails to be met, the procedure returns to steps 404, 424. Finally, the sampling termination is set (step 414).

Here, let us explain about the calculation of the smoothed differential coefficient time series data Di, D'i. The digital filter circuits 12, 22, 14, 24 may use secondary Bataworth lowpass filters, for example. The digital filter circuits 12, 22 have the same configuration and their coefficients b, a may or may not be equal. Here, only the digital filter circuit 12 will be described. The secondary Bataworth lowpass filter calculates the smoothed time series data Yi from the equation (1).

$$Yi = b1yi + b2yi{-}1 + b3yi{-}2 - [a2Yi{-}1 + a3Yi{-}2] \tag{1}$$

Here, coefficients b, a vary depending on the sampling frequency and cutoff frequency. The coefficient values of the digital filters may differ between the wavelength range for the step height (first wavelength band, e.g., 275 nm to 500 nm) and the wavelength range for the mask layer thickness reduction (remaining mask layer thickness) (second wavelength band, e.g., 525 nm to 750 nm). For the step height wavelength range, a2=−1.143, a3=0.4128, b1=0.067455, b2=0.13491, b3=0.067455 (sampling frequency of 10 Hz, cutoff frequency of 1 Hz). For the remaining mask layer thickness wavelength range, a2=−0.00073612, a3=0.17157, b1=0.29271, b2=0.58542 and b3=0.29271 (cutoff frequency of 0.25 Hz).

The second differential coefficient time series data di, d'i are calculated as follows by the differentiators 13, 23 according to the polynomial adaptation smoothing differential method (S-G method) that uses 5-point time series data Yi from equation (2).

$$di = d'i = \sum_{j=-2}^{j=2} wjYi+j \quad (2)$$

As for the weight w, w−2=2, w−1=−1, w0=−2, w1=−1, and w2=2.

The differentiators 13, 23 may or may not have equal values of j.

The smoothed differential coefficient time series data Di, D'i can be determined by the second digital filter circuits 14, 24 (secondary Bataworth lowpass filters) from equations (3) and (4) using the differential coefficient time series data di, d'i. The coefficients a, b may be different between the second digital filter circuits 14, 24.

$$Di = b1di + b2di-1 + b3di-2[a2Di-1+a3Di-2] \quad (3)$$

$$D'i = b1d'i + b2d'i-1 + b3d'i-2 - [a2D'i-1+a3D'i-2] \quad (4)$$

In this way, the etch quantity measuring apparatus 10 of FIG. 1 can determine the step height and the remaining mask layer thickness by setting at least one standard pattern of differential value for multiple wavelengths, such as PA, PB, PC, Pa, Pb and Pc shown in FIG. 3A and FIG. 3B, measuring the intensities of interference light of multiple wavelengths from the silicon wafer being processed, determining an actual pattern of differential value of measured interference light intensity of each wavelength, and comparing the standard patterns and the actual patterns of differential value. When it is desired to detect the silicon etched depth of 335 nm, i.e., the position B of FIG. 2, the procedure involves setting in advance the differential value standard patterns PB, Pb corresponding to the etch quantity (step height and remaining mask layer thickness) B, b for multiple wavelengths, checking whether matching factors of the actual patterns with respect to the standard patterns for multiple wavelengths come within the decision criteria $\sigma_{SO}$, $\sigma_{MO}$, and, if so, deciding that the step height 44 is now 400 nm and the remaining mask layer thickness 42 is 65 nm (etched depth 43 in silicon substrate is 335 nm). The standard pattern may use the first differential pattern or the second differential pattern, or both. With this embodiment, by determining the etch quantity of the material being etched (step height and remaining mask layer thickness), it is possible to accurately detect when the silicon etched depth is 335 nm, for example.

Figure 5:
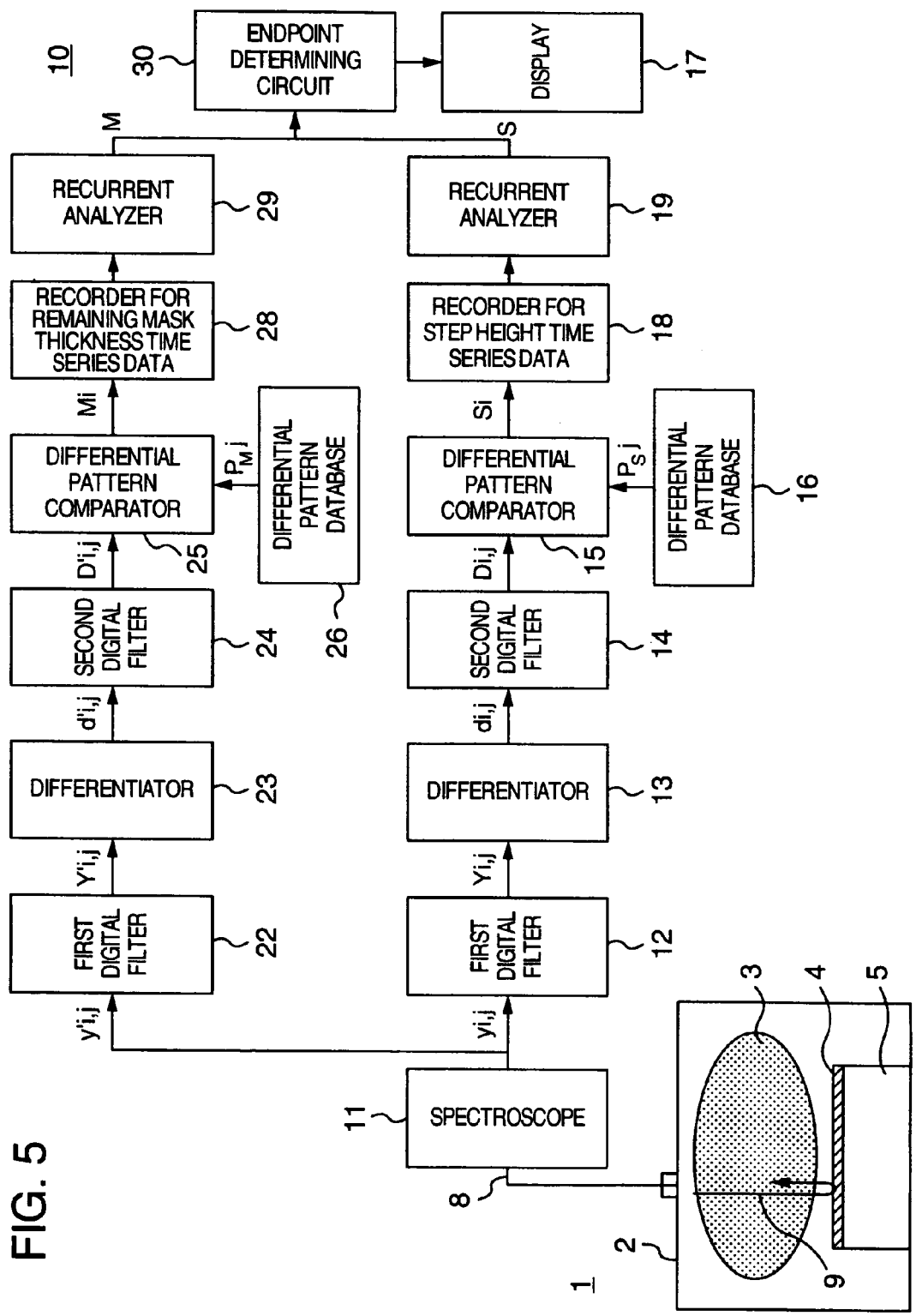
FIG. 5 is a block diagram showing an overall configuration of a semiconductor wafer etching apparatus having an etch depth measuring apparatus according to a variation of the first embodiment of the present invention.
Figure 6:
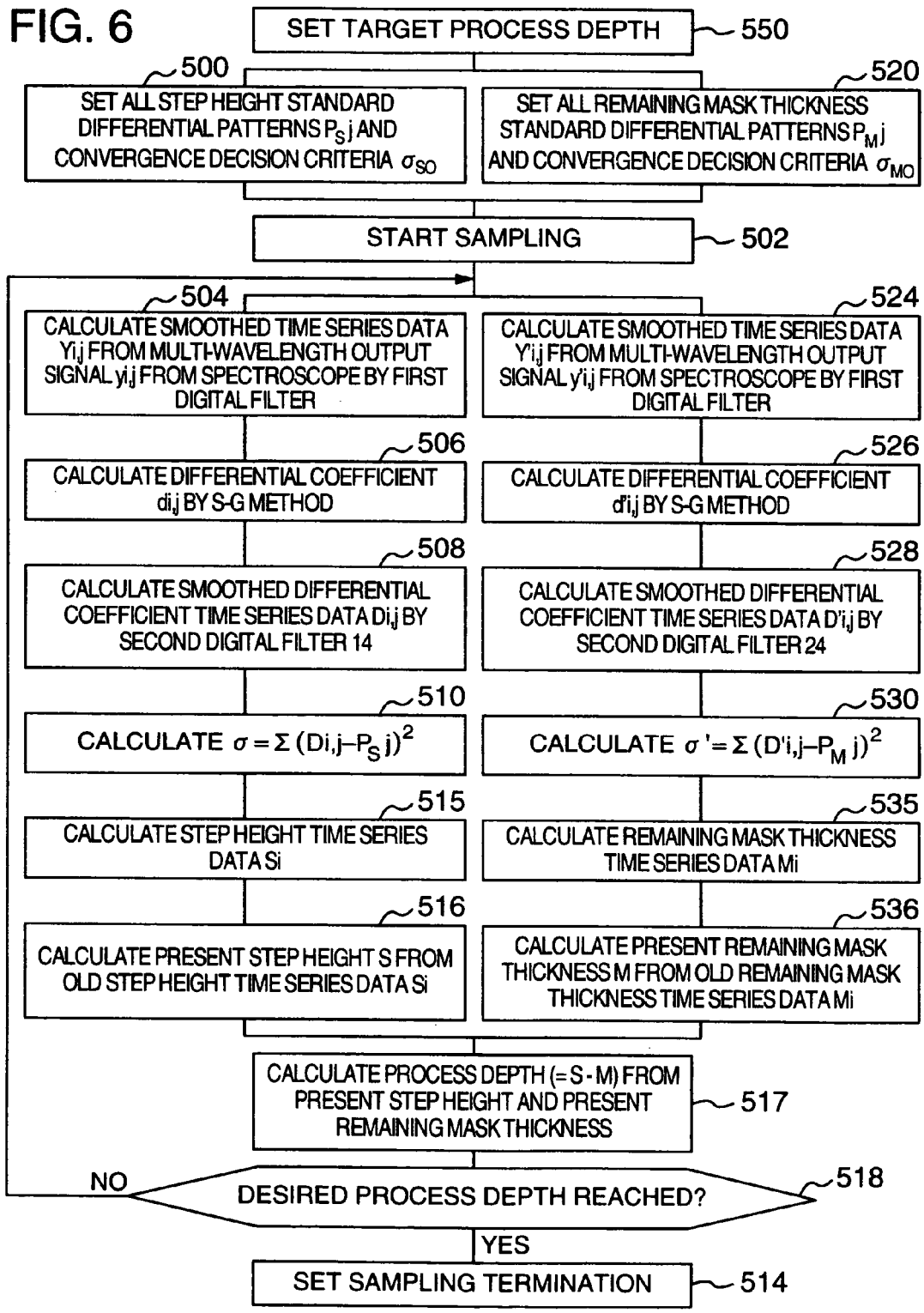
FIG. 6 is a flow chart showing an operation of the embodiment of FIG. 5.

Next, a variation of the first embodiment intended to improve the precision of measuring the etch quantity when the interference light intensity being measured contains noise components, will be explained by referring to the block diagram of FIG. 5 showing the configuration of this variation and the flow chart of FIG. 6. This variation may be applied where the pattern differs from one wafer to another and thus different wafers have different etching conditions (such as discharge conditions) and therefore different interference waves. First, a target process depth (here, the target etch depth: 43 in FIG. 2A) in the material to be processed (silicon wafer and mask layer) is set (step 550). Next, the step height, the differential waveform pattern for the remaining mask layer thickness and the convergence decision criteria (step height: $P_Sj$, $\sigma_{SO}$, remaining mask layer thickness: $P_Mj$, $\sigma_{MO}$) are read out from the differential waveform pattern databases 16, 26 and set in the differential pattern comparators 15, 25. When the etching process is started, the sampling of the interference light is started (step 502). Next, as in the steps 404, 410, 424–430 of FIG. 4, steps 504–510, 524–530 are executed. The light from the spectroscope 11 in the short wavelength range and the long wavelength range are supplied to the first digital filter circuits 12, 22 and differentiators 13, 23 and to the second digital filter circuits 14, 24 to determine smoothed differential coefficient time series data Di,j, D'i,j. The smoothed differential coefficient time series data Di,j, D'i,j are compared with the differential patterns $P_Sj$, $P_Mj$ set beforehand in the differential pattern comparators 15, 25 to calculate a step height Si and a mask layer thickness reduction (remaining mask layer thickness) Mi at that time (steps 515, 535). When $\sigma > \sigma_{SO}$ (or $\sigma > \sigma_{MO}$), Si (or Mi) that was obtained at time of step 515 (or step 535) is not stored and the processing by the recurrent analyzer 19 excludes the data of remaining mask layer thickness at this point in time.

The step height and the remaining mask layer thickness obtained at steps 515, 535 are stored in the data recorders 18, 28 as time series data Si, Mi. Using the stored old time series data Sj, Mj, the recurrent analyzers 19, 29 calculate a first-order regression line Y=Xa*t+Xb (Y: etch quantity (step height and remaining mask layer thickness), t: etch time, |Xa|: etch rate; the absolute value of Xa represents an etch rate, Xb: initial mask layer thickness). From this regression line, an etch quantity (step height: S, remaining mask layer thickness: M) at present time is calculated (steps 516, 536). Here, the etch time, the etch rate, the initial mask layer thickness, the remaining mask layer thickness, etc. are process quantities (in this case, etch quantities).

Next, the endpoint determining circuit 30 calculates the process depth (S−M, or 43 in FIG. 2A) from these etch quantities S, M. This value is compared with the target process depth. If it is found to be equal to or larger than the target process depth, it is decided that the etch quantity of the material being processed has reached the predetermined value. The etching process is then terminated and the result is displayed on the display 17. When the calculated process depth is smaller than the target process depth, the procedure returns to steps 504, 524. As a final step, the sampling termination is set. (step 514).

Figure 7:
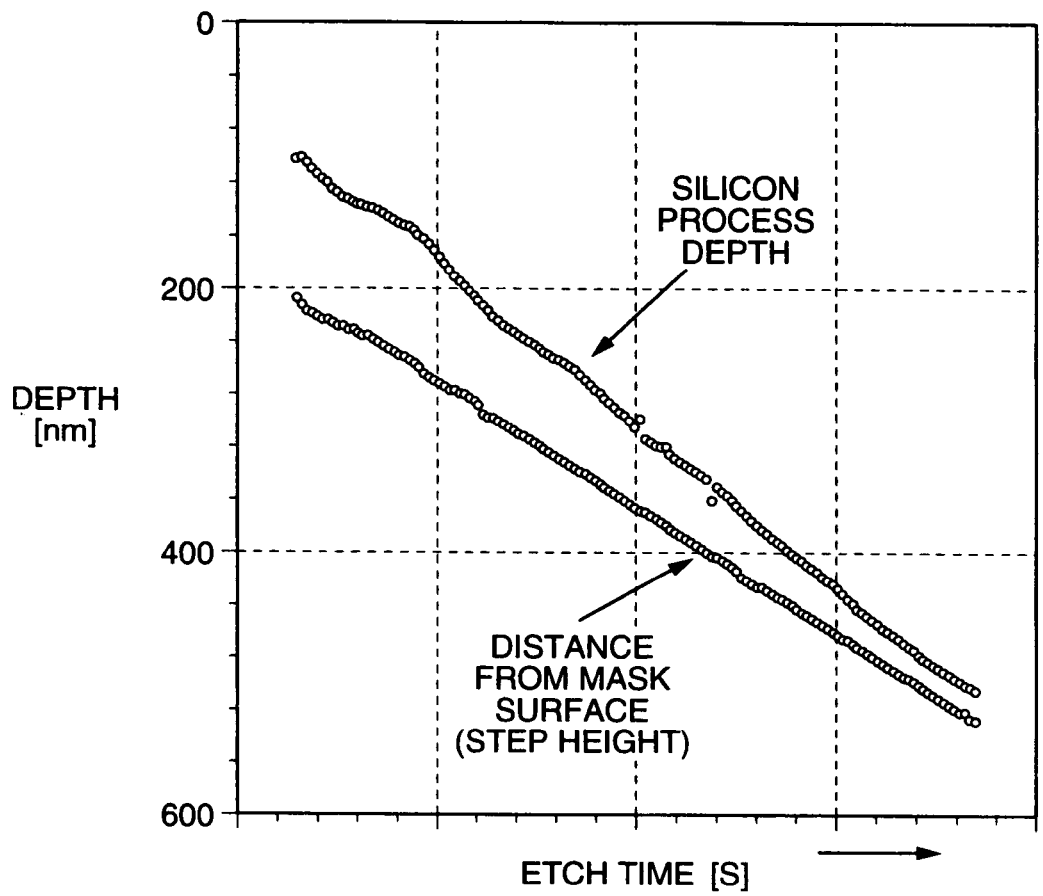
FIG. 7 is a diagram showing measurements of an etch depth in the embodiment of FIG. 5.

FIG. 7 shows a result of measurement of the silicon depth obtained in the above embodiment (values calculated by steps 516, 536). The diagram shows changes over time of the silicon process depth and of the depth from the mask layer, clearly showing how the etching process was performed during the STI process. In this embodiment, the etching was done until the silicon depth was 506 nm (step height: 529 nm).

With the etch quantity measuring apparatus of this embodiment described above, the etch quantity of the material being processed in the semiconductor device manufacturing process can be measured accurately. The use of this system can therefore provide a method of etching a material with high precision. Further, unlike the first embodiment, this variation of the first embodiment can measure an arbitrary etch quantity of the material other than those set by the standard patterns.

In FIG. 5, the configuration comprising the first digital filter circuit, differentiator, second digital filter circuit, differential waveform pattern database, differential pattern comparator and recurrent analyzer is provided for each of the first and second wavelength bands. It is also possible to provide only one such configuration commonly for both the first and second wavelength bands and to switch between the differential coefficients at predetermined intervals to produce an actual pattern alternately for the first and second wavelength bands.

Figure 9:
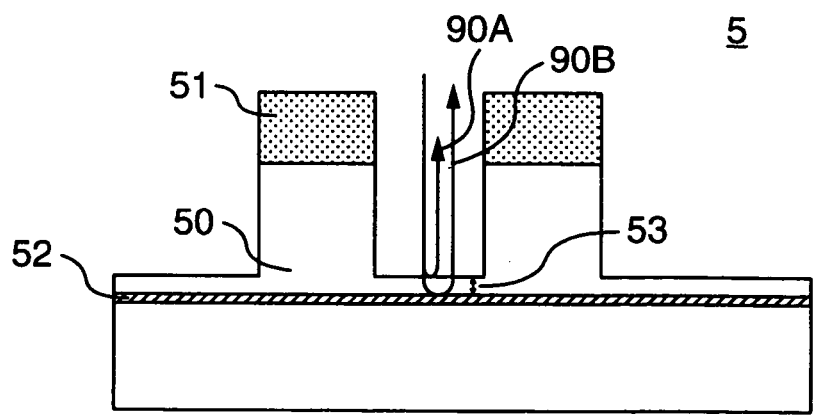
FIG. 9 is a vertical cross section of a wafer being etched.
Figure 8:
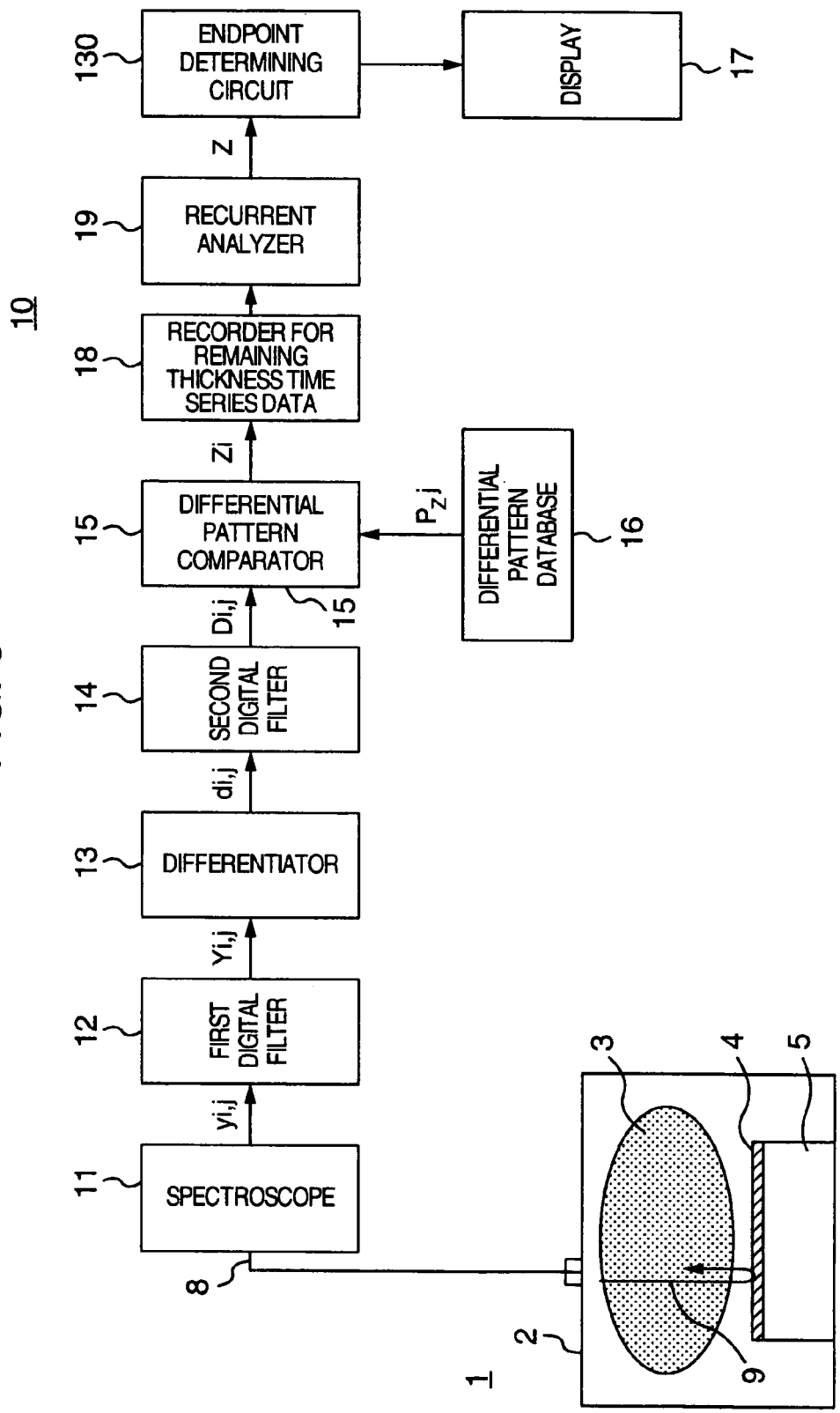
FIG. 8 is a block diagram showing an overall configuration of a semiconductor wafer etching apparatus having a remaining film thickness measuring apparatus according to a second embodiment of the present invention.
Figure 10:
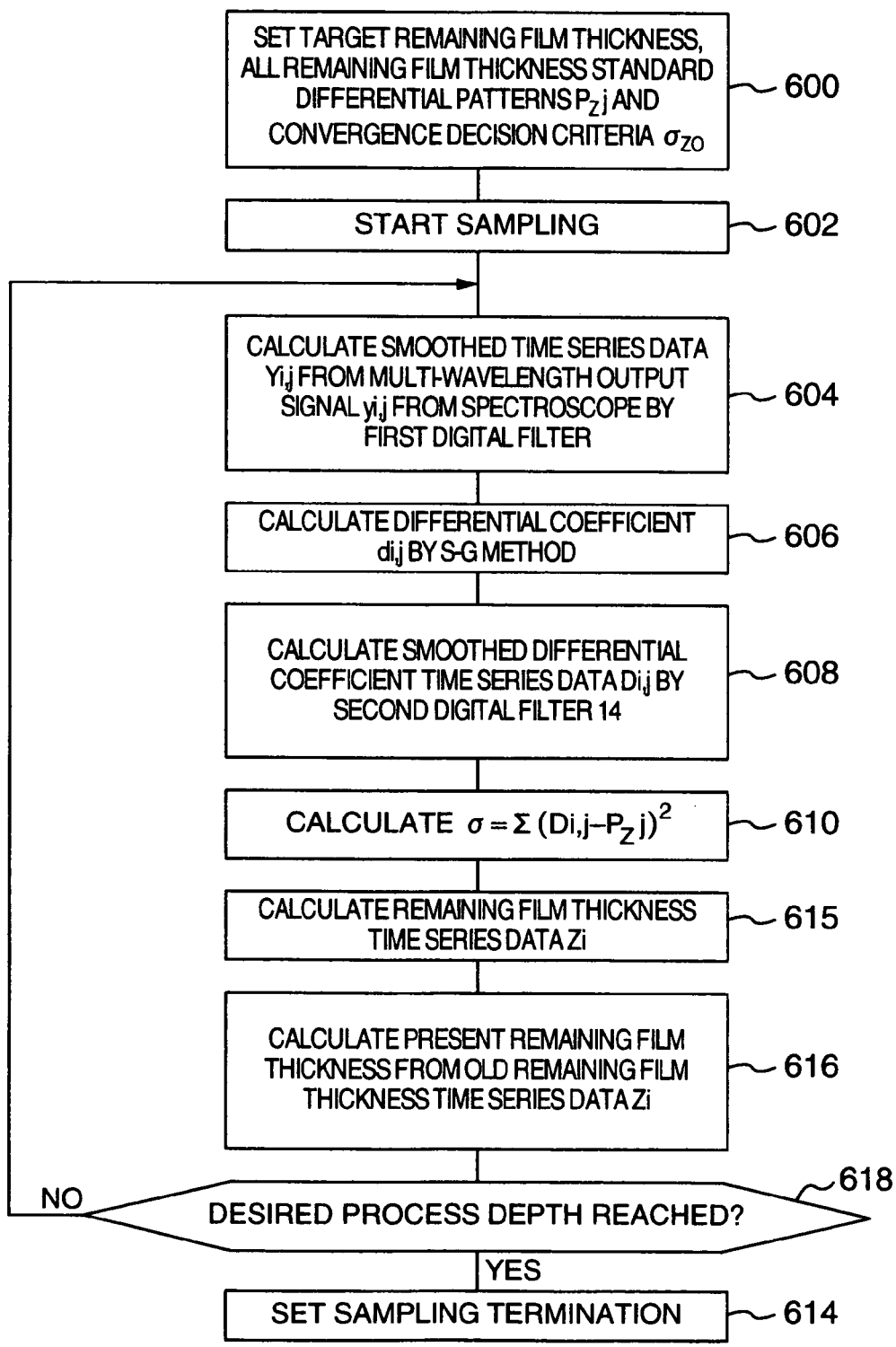
FIG. 10 is a flow chart showing an operation of the embodiment of FIG. 8.

Next, a second embodiment of the present invention will be described by referring to FIGS. 8, 9, 10 and 11. The configuration of this embodiment shown in FIG. 8 is identical with the configuration 11–19 of FIG. 5 for one wavelength band and the operation of the endpoint determining circuit 130 is different from that of the endpoint determining circuit 30 of FIG. 5. The structure of the material to be etched is shown in FIG. 9. The area of a polysilicon 50 processed by this etching process lies where there is no mask layer 51 (e.g., nitride film and photoresist). The observed interference light is produced by the interference between light 90A reflected by the surface of the polysilicon 50 and light 90B reflected by an underlying oxide film 52. A method of measuring the etch quantity (remaining thickness 53: thickness of polysilicon measured from the underlying oxide film) by measuring the interference light will be explained with reference to the flow chart of FIG. 10.

First, a target remaining thickness of the material to be processed (polysilicon), and all standard differential patterns ($P_Z j$) associated with the polysilicon film thickness and convergence decision criteria $\sigma_{Z0}$ stored in advance in the differential waveform pattern database 16 are set in the differential pattern comparator 15 (step 600). When the etching process is started, the interference light sampling is started (step 602). The light of multiple wavelengths from the spectroscope 11 is supplied to the first digital filter 12, differentiator 13 and second digital filter 14 to determine smoothed differential coefficient time series data Di,j in a way similar to the steps 404–410 in the first embodiment. The smoothed differential coefficient time series data Di,j are compared with the differential pattern $P_Z j$ preset in the differential pattern comparator 15 to calculate the remaining film thickness Zi at that point in time (step 615). When $\sigma > \sigma_{Z0}$, the Zi value obtained at this point in time by step 615 is not saved and the processing by the recurrent analyzer 19 excludes the data of the remaining film thickness at this point in time.

The remaining film thickness obtained at step 615 is stored as time series data Zi in data recorder 18. By using the stored old time series data Zi, the recurrent analyzer 19 determines the first-order regression line Y=Ya*t+Xb (Y: remaining film thickness, t: etch time, |Xa|: etch rate, Xb: initial film thickness) and, based on the regression line, calculates the remaining film thickness Z at the current time (step 616).

Next, the endpoint determining circuit 130 compares the remaining film thickness Z and the target remaining film thickness. If the remaining film thickness Z is found to be equal to or less than the target thickness, it is decided that the etch quantity of the material has reached the predetermined value and the result is displayed on the display 17. When the remaining film thickness Z is larger than the target value, the procedure returns to step 604. As a final step, the sampling termination is set (step 614).

When at step 618 it is decided that the target remaining film thickness is smaller than the differential patterns $P_Z j$ of the polysilicon film thickness stored in advance in the differential waveform pattern database 16, the following processing is performed before ending the etching process. When the remaining film thickness Z is equal to the minimum film thickness Ym available in the differential waveform pattern database 16 of the polysilicon film thickness, an etching time at which the remaining film thickness will become the target remaining film thickness $Y_T(t_T=[Y_T-Xb]/Xa)$ is calculated from the first-order regression line Y=Xa*t+Xb and the etching process is continued up to the time $t_T$.

Figure 11:
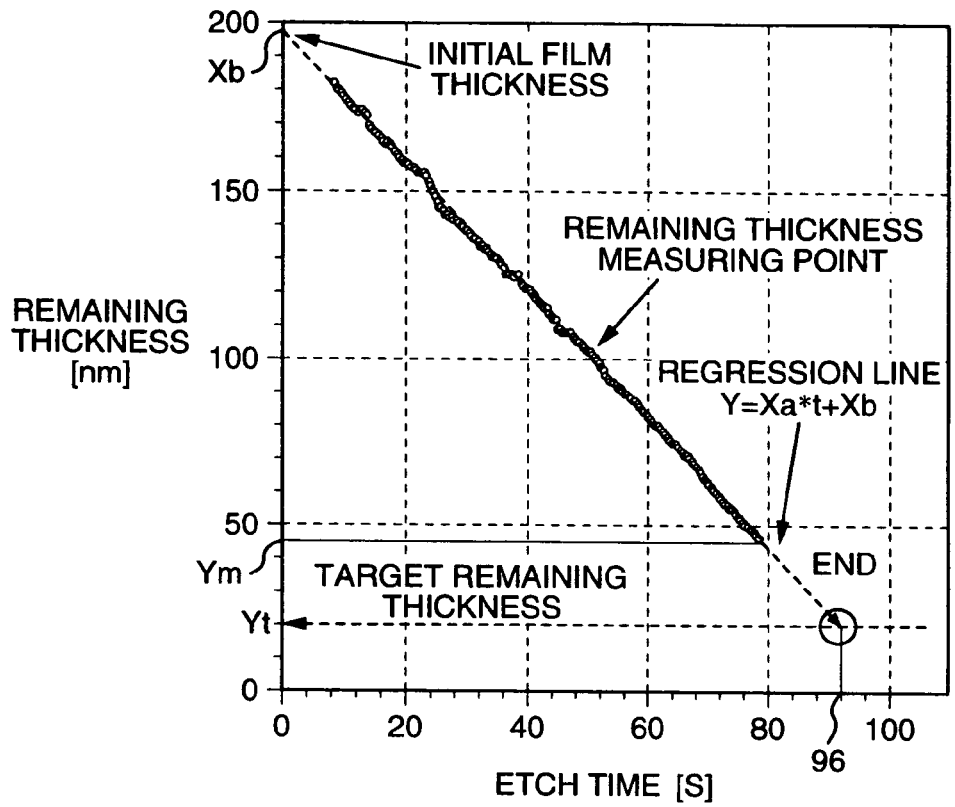
FIG. 11 is a diagram showing measurements of a remaining polysilicon thickness and a regression line in the embodiment of FIG. 8.

FIG. 11 shows a result of measurement of the polysilicon's remaining thickness in this embodiment. This diagram represents a case where by using the differential waveform pattern database that has polysilicon film thickness data down to a minimum thickness Ym of 45 nm, a target remaining film thickness Yt of 20 nm is estimated. The diagram clearly shows from the first-order regression line that the etching time at which the target remaining film thickness of 20 nm will be reached is 96 seconds. It is therefore possible to make a decision on a remaining film thickness for which the associated differential waveform pattern database is not available.

The absolute value of the first-order regression line (=|Xa|) represents an etch rate. By controlling the etch rates in the mass production, the status of the etching apparatus can be controlled. That is, when the etch rate is within an allowable range, it can be decided that the etching apparatus is operating in normal condition. If the etch rate is outside the allowable range, the etching apparatus can be determined as abnormal.

Further, an intersecting point of the first-order regression line (=Xb) represents an initial thickness of the material. Controlling this initial thickness in the mass production can control the deposition state prior to the etching process. That is, if the initial film thickness is within an allowable range, the film deposition apparatus can be known to be operating normally. If it is outside the allowable range, the apparatus can be determined as abnormal and this check result can be fed back.

Figure 13:
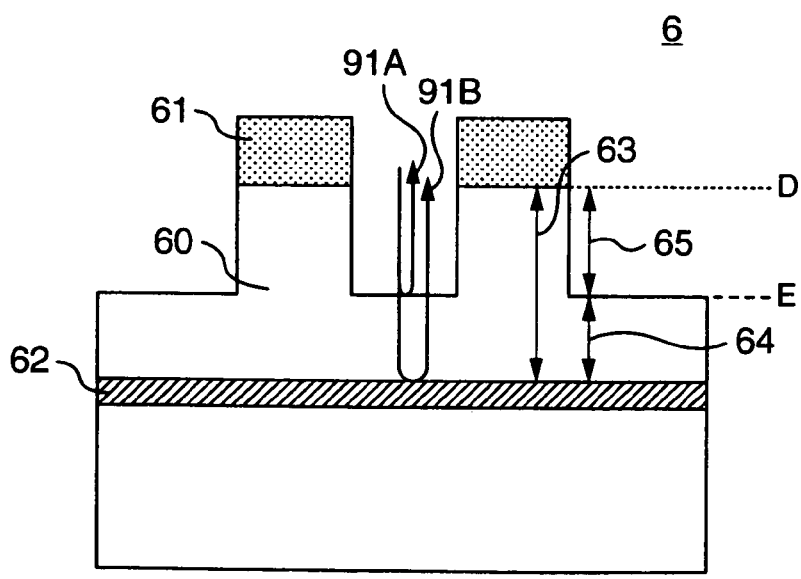
FIG. 13 is a vertical cross section of a wafer being etched.
Figure 12:
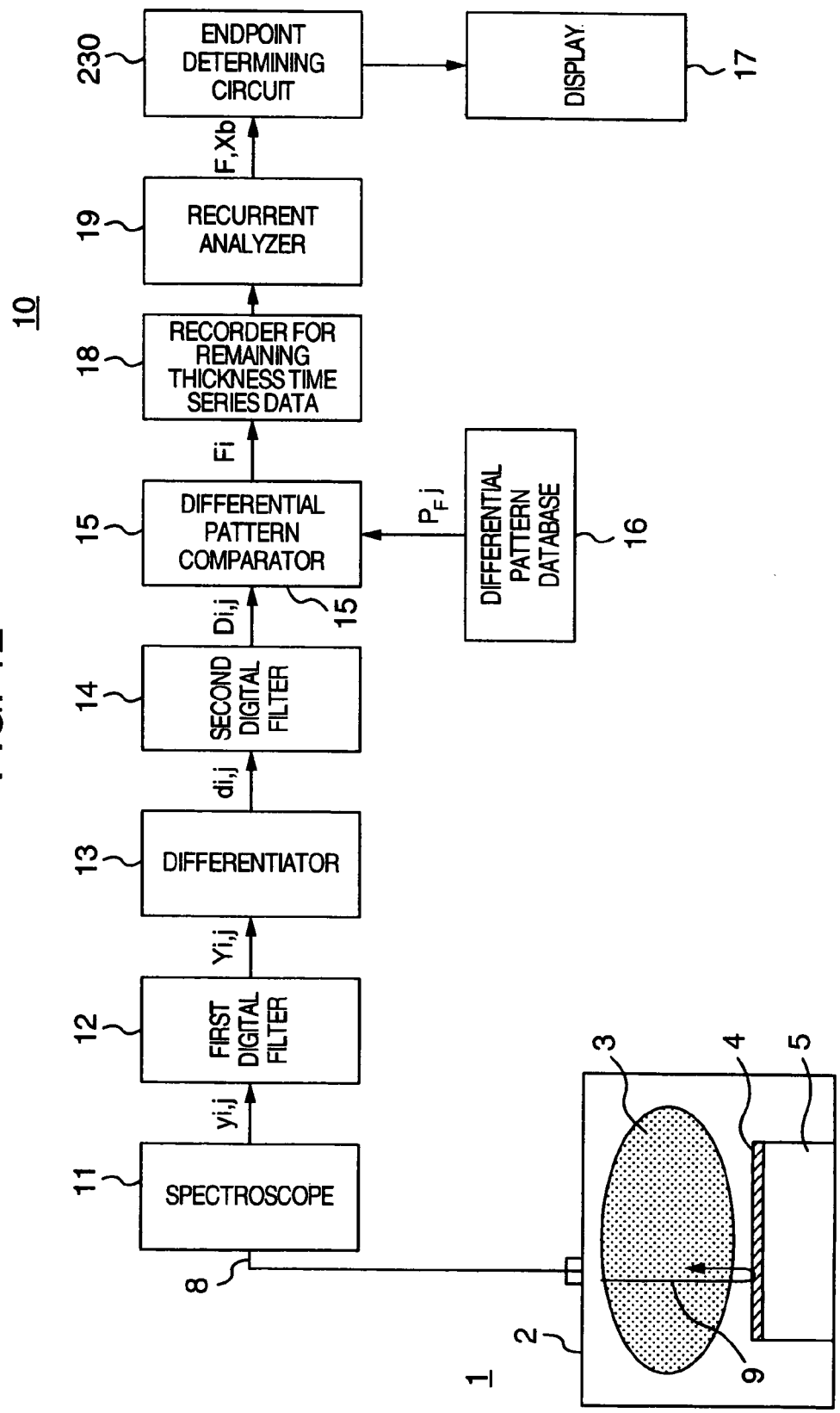
FIG. 12 is a block diagram showing an overall configuration of a semiconductor wafer etching apparatus having an etch depth measuring apparatus according to a third embodiment of the present invention.

Next, a third embodiment of the present invention will be described by referring to FIG. 12 and FIG. 13. In controlling the etch depth, this embodiment determines the etch depth from the initial film thickness and the measured remaining film thickness because wafers have errors in the thickness of an organic film. The configuration shown in FIG. 12 is the same as the configuration 11–19 of FIG. 8 and the operation of the endpoint determining circuit 230 differs from that of the endpoint determining circuit 130 of FIG. 8. The structure of a material to be etched is shown in FIG. 13. The area of an organic film 60 to be etched (groove structure) lies where there is no mask layer 61 (e.g., nitride film and photoresist). The interference light observed is produced by interference between light reflected by the surface of the organic film and light reflected by an interconnect layer 62 (e.g., Cu).

Figure 14:
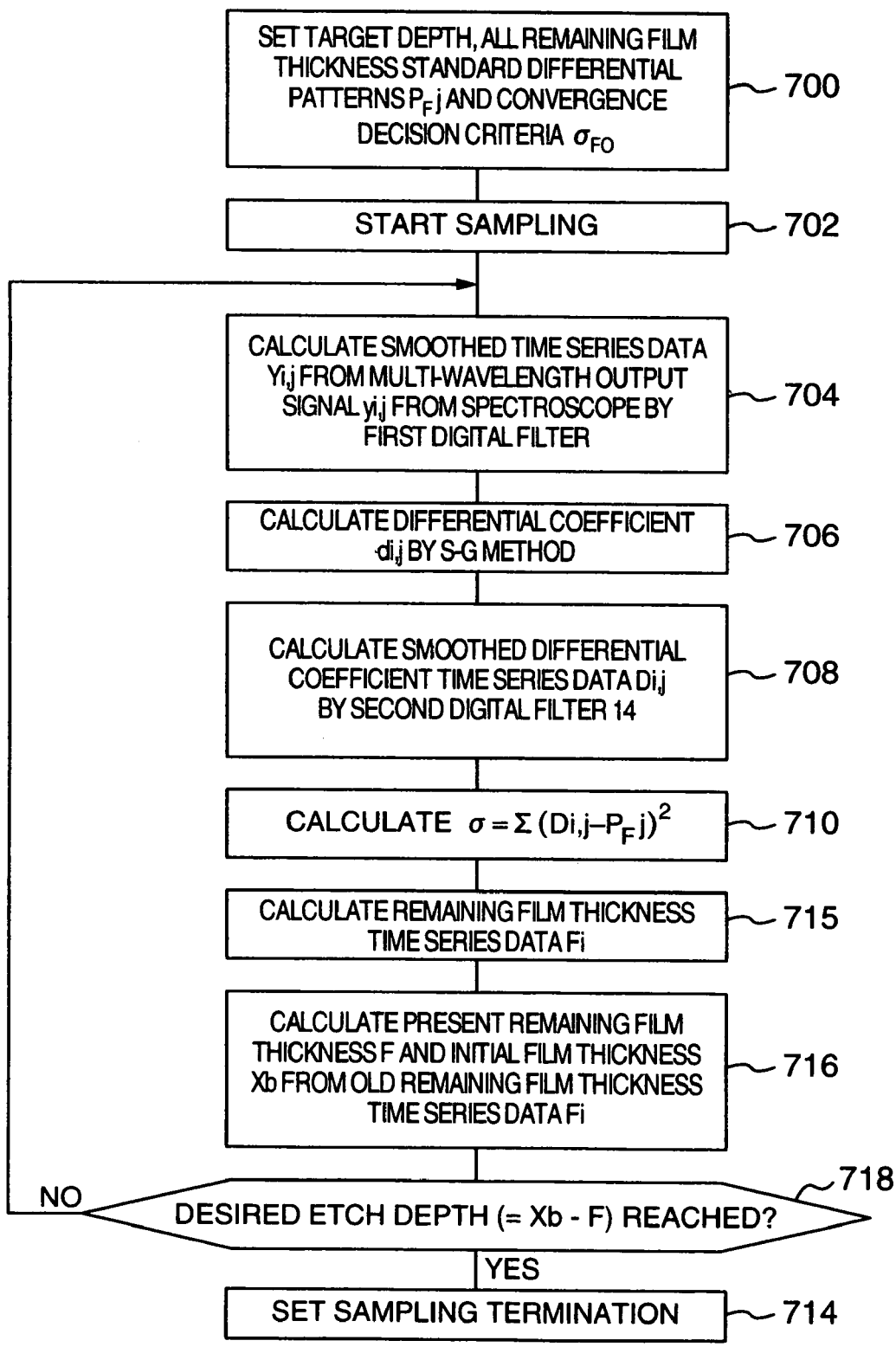
FIG. 14 is a flow chart showing an operation of the embodiment of FIG. 12.

The method of measuring an etch quantity (groove depth 65: distance between D and E) by measuring the interference light will be explained with reference to the flow chart of FIG. 14. First, a target depth of the material to be etched (organic film), all standard differential patterns associated with the organic film thickness ($P_F j$) stored in advance in the differential waveform pattern database 16 and convergence decision criteria ($\sigma_{F0}$) are set in the differential pattern comparator 15 (step 700). When the etching process is started, the interference light sampling is started (step 702). The light of multiple wavelengths from the spectroscope 11 is supplied to the first digital filter 12, differentiator 13 and second digital filter 14 to determine smoothed differential coefficient time series data Di,j, as in the steps 604–610 of the second embodiment. These smoothed differential coefficient time series data Di,j are compared with the differential patterns $P_F j$ preset in the differential pattern comparator 15 to calculate a remaining film thickness Fi at that point in time (step 715). When $\sigma > \sigma_{F0}$, the remaining film thickness at this point in time is not saved and the processing by the recurrent analyzer 19 excludes the remaining film thickness data obtained at this point in time.

The remaining film thickness obtained at step 715 is stored as time series data Fi in the data recorder 18. By using the stored old time series data Fj, the recurrent analyzer 19 determines a first-order regression line Y=Xa*t+Xb (Y: remaining film thickness, t: etch time, Xa: etch rate, Xb: initial film thickness) and, based on this regression line, calculates the remaining film thickness F at the current time and the initial film thickness Xb (step 716).

Next, the endpoint determining circuit 230 determines a groove depth at the current time (=Xb−F) (65 in FIG. 13) from the remaining film thickness F (64 in FIG. 13) and the initial film thickness Xb (63 in FIG. 13) and compares the groove depth with the target depth. If the groove depth is equal to or more than the target depth, it is decided that the etch quantity of the material has reached the predetermined value and the result is displayed on the display 17. When the groove depth is less than the target depth, the procedure returns to step 704. As a final step, the sampling termination is set (step 714). In this way, the etch depth when forming a groove can be measured by determining the remaining film thickness F and the initial film thickness Xb by the recurrent analysis.

Figure 15:
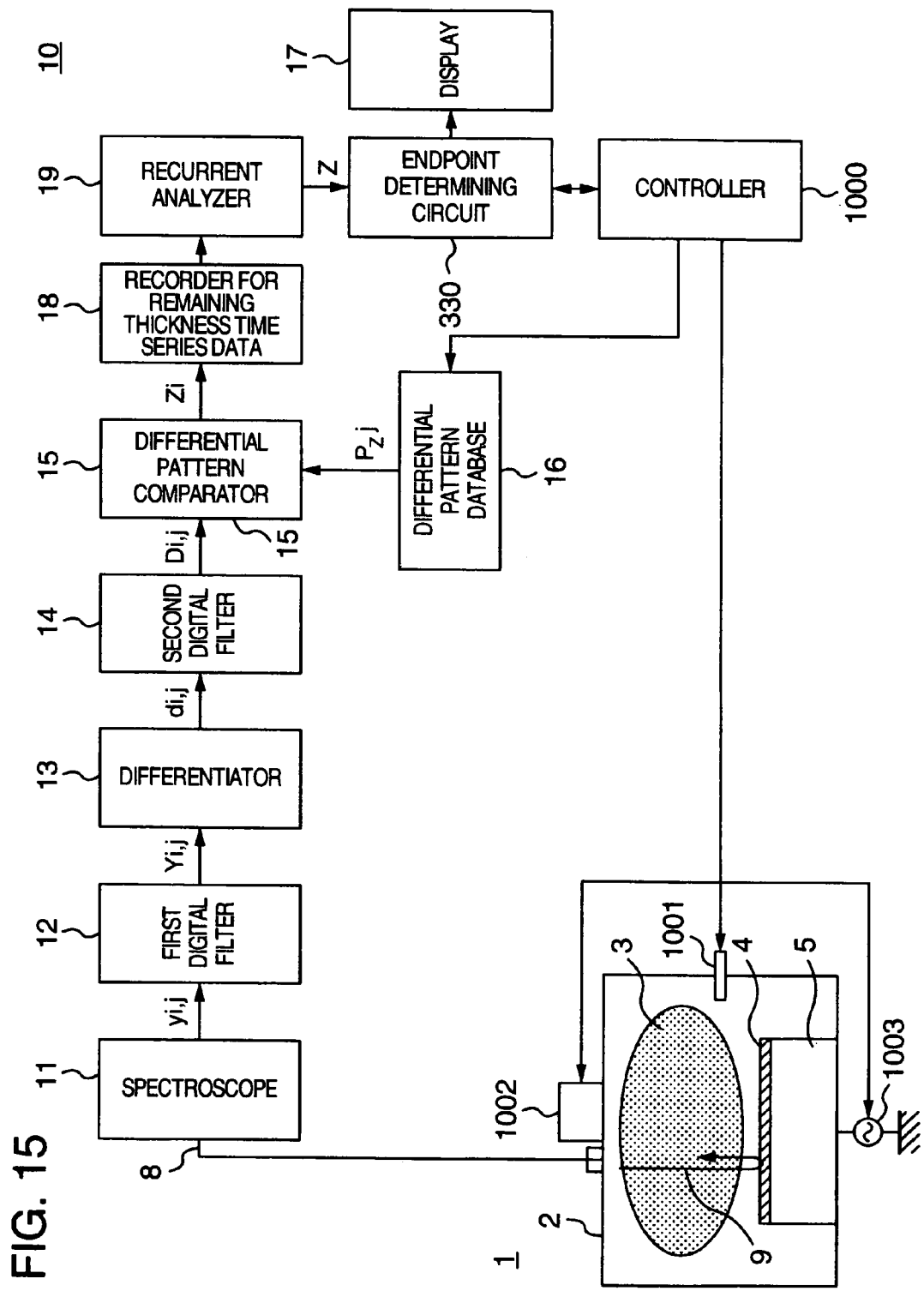
FIG. 15 is a block diagram showing an overall configuration of a semiconductor wafer etching apparatus having a remaining film thickness measuring apparatus according to a fourth embodiment of the present invention.
Figure 16:
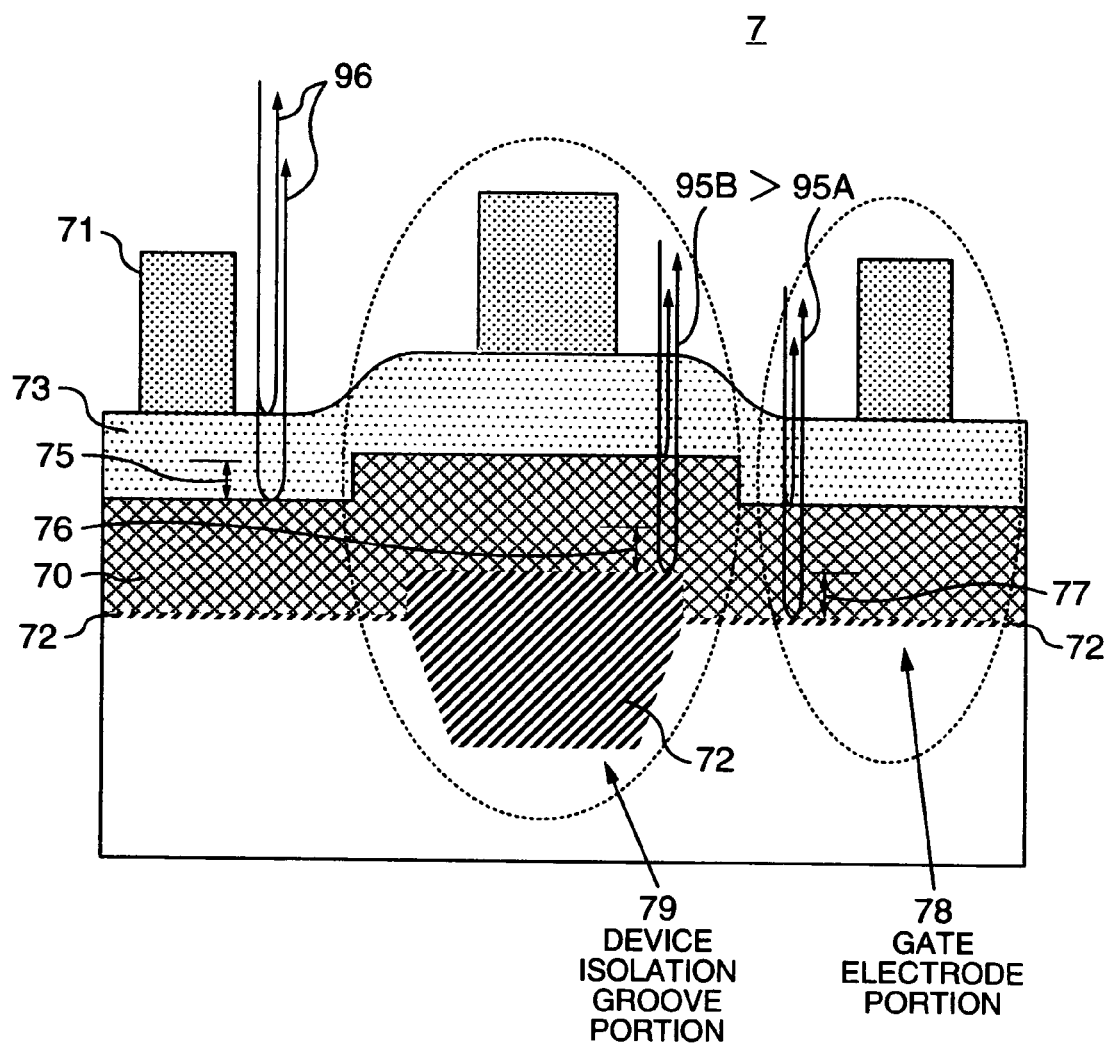
FIG. 16 is a vertical cross section of a wafer being etched.

Next, a fourth embodiment of the present invention will be described by referring to FIGS. 15, 16 and 17. The configuration of this embodiment shown in FIG. 15 is identical with the configuration 11–19 of FIG. 12, and the operation of an endpoint determining circuit 330 differs from that of the endpoint determining circuit 230 of FIG. 12. This embodiment has a controller 1000. One and the same etching apparatus 1 is often used to etch various materials with different film properties. In that case, the etching process is carried out by time-controlling a gas supply unit 1001, a plasma generator 1002 and a wafer bias power supply 1003 by the controller 1000 according to etching conditions (e.g., etching gas condition, plasma generating power condition and bias condition) preset in the controller 1000. When the material to be etched has a stacked semiconductor device structure as shown in FIG. 16, however, the etching process becomes complicated and the device fabrication without damages is difficult to achieve with a simple time-controlled etching process. Now the process of etching such stacked device structure will be described by referring to FIG. 16. Overlying a polysilicon film 70 to be etched by this etching process are a BARC 73 (Back Anti-Reflection Coating) and a mask layer 71 (e.g., nitride film and photoresist). Underlying the polysilicon film 70 is an oxide film 72. The underlying oxide film 72 has a structure in which its thickness at a transistor gate electrode portion 77 (e.g., about 2 nm) is greatly different from that at a transistor device isolation groove portion 79 (STI) (e.g., about 300 nm). In processing this structure, the BARC 73 is first etched, followed by the polysilicon film 70 being etched by the same etching apparatus. In this etching process, if these films fail to be etched correctly, the oxide film 72 underlying the gate electrode portion 78 may be overetched causing damages to the device. For this reason, the etching of the BARC 73 must be controlled so as to prevent the polysilicon film 70 from being etched as practically as possible. It is therefore important in the BARC etching process to measure the remaining thickness of the BARC 73; when the remaining thickness 75 is small (e.g., 20 nm), to change the etching condition to the one that renders the polysilicon difficult to etch; and to etch the remaining BARC 73 under this condition. Next, during the process of etching the polysilicon film 70, it is important that the remaining thickness of the polysilicon be measured and, when the remaining thickness 77 becomes small (e.g., 20 nm), the etching condition be changed to the one that renders the underlying oxide film difficult to etch and under this condition the remaining polysilicon 70 be etched.

The light used to measure the remaining thickness of BARC is interference light 96 produced by interference between light reflected from the BARC surface and light reflected from a polysilicon boundary surface. In measuring the remaining thickness of the polysilicon, interference light 95A or 95B is used which is produced by interference between light reflected from the polysilicon surface and light from the underlying oxide film boundary surface. Because the thickness 77 of the underlying oxide film 72 at the gate electrode portion 78 differs from the thickness 76 at the transistor device isolation groove portion 79, the interference light intensities 95A, 95B from these portions also differ, with the interference light intensity 95B from the device isolation portion 79 stronger than the interference light intensity 95A from the gate electrode portion 78. Hence, the measurement of the remaining thickness of the polysilicon is carried out based on the polysilicon at the device separation portion 79. With the above discussion taken into consideration, the polysilicon etching process uses the interference light intensity 95B to perform the etching until the remaining polysilicon thickness is equal to the thickness 76, after which the remaining polysilicon is again etched under the etching condition that makes the underlying oxide film difficult to etch.

The procedure for this etching process will be explained with reference to the flow chart of FIG. 17. First, the etching conditions for the stacked films such as BARC 73 and polysilicon 70 (e.g., gas condition, discharge condition and pressure condition), target remaining thicknesses 75, 76 of the films 73, 70, and convergence decision criteria are set in the controller 1000 (step 800). Next, according to the kinds of films to be processed, all standard differential patterns ($P_Zj$) for the thicknesses of the films 73, 70 stored in advance in the differential waveform pattern database 16 and convergence decision criteria ($\sigma_{Z0}$) are set in the differential pattern comparator 15 (step 801). At the next step the etching process and the interference light sampling are started (step 802). Then, according to the instruction from the controller 1000, the standard differential pattern $P_Zj$ and the convergence decision criterion $\sigma_{Z0}$ for the material to be etched first (e.g., BARC) are picked up from the differential waveform pattern database 16 and set in the differential pattern comparator 15 (step 803). The rays of light of multiple wavelengths from the spectroscope 11 are supplied to the first digital filter 12 that produces smoothed time series data Yi,j (step 804). Further, the differentiator 13 and the second digital filter 14, as in the steps 704–710 in the third embodiment, determine the smoothed differential coefficient time series data Di,j (steps 806, 808). These smoothed differential coefficient time series data Di,j are compared with the differential patterns $P_Fj$ preset in the differential pattern comparator 15 to determine a remaining film thickness corresponding to the minimum convergence value of $\sigma=\Sigma(Di,j-P_Zj)^2$. When $\sigma \leq \sigma_{Z0}$, the remaining film thickness thus obtained is taken as the remaining film thickness value Zi at this point in time and stored in the data recorder 18 (steps 810, 815). When $\sigma > \sigma_{Z0}$, the remaining film thickness value at this point in time is not saved and the processing by the recurrent analyzer 19 excludes the remaining film thickness data at that point in time (step 815). By using the old stored time series data Zi, the recurrent analyzer 19 determines a first-order regression line Y=Ya*t+Xb and, based on this regression line, calculates the remaining film thickness Z at the current time (step 816).

Next, the endpoint determining circuit 330 compares the present remaining film thickness Z with the target remaining film thickness 75 issued from the controller 1000 (e.g., BARC remaining film thickness of 20 nm). If the present remaining film thickness Z is equal to or less than the target remaining film thickness 75, it is decided that the etch quantity of the material being etched has reached the predetermined value and the result is displayed on the display 17. At the same time, the etching condition is changed to another BARC etching condition under which the polysilicon is not easily etched, and the next etching process is performed under this condition (step 818). When the current remaining film thickness Z is larger than the target thickness, the procedure returns to step 804. Under the second selected BARC etching condition (under which the polysilicon is not easily etched), the controller 1000 controls the wafer bias power supply 1003 to etch the remaining portion of the film and, after a predetermined time has passed, a check is made as to whether the etching condition needs to be switched for etching the next film (step 819).

In the etching of the next film (e.g., polysilicon 70), the gas supply unit 1001, the plasma generator 1002 and the wafer bias power supply 1003 are controlled to conform to the preset etching condition. At the same time, the standard differential patterns ($P_Zj$, $\sigma_{Z0}$) of the remaining thickness 76 of the film to be etched (e.g., polysilicon) are set in the differential pattern comparator 15 (step 803) and the steps 804 to 818 are again executed. The endpoint determining circuit 330 detects when the remaining polysilicon thickness Z is equal to the target thickness 76 (e.g., remaining polysilicon thickness of 20 nm) (step 818) and displays the detection result on the display 17. At the same time, the etching condition is changed to another polysilicon etching condition under which the underlying oxide film is not easily etched) (step 818). This second etching (under the polysilicon etching condition that renders the underlying oxide film difficult to etch) is time-controlled to etch the remaining portion of the polysilicon and, after a predetermined time has passed, a check is made as to whether the etching condition needs to be switched for etching the next film (step 819). When no further etching is to be performed, the etching process termination and the sampling termination are set (step 814).

As described above, with the method of the second embodiment described above, the remaining film thickness can be estimated even when the differential pattern database associated with the remaining thickness of the material being etched is not sufficient. Further, in generating the differential pattern database for the remaining film thickness, the sample wafer does not need to be etched completely and the number of sample wafers can be reduced.

Further, because the etch rate can be determined by the recurrent analysis of this invention, the etch rate can be controlled for each wafer during the mass production, thus preventing possible failures of product wafers.

Further, because the initial thickness of the material being etched can be calculated by the recurrent analysis of this invention, the feedback of the calculated result can control the overall process involving the film deposition apparatus and the etching apparatus during the mass production.

According to the method of the third embodiment, even when there are variations in the initial thickness of the material to be etched, it is possible to calculate the current etch depth with high precision and correctly determine when the current etch depth is equal to the target etch depth.

Further, with the method of the fourth embodiment, in the process of etching a stacked film structure the overetching of the underlying film can be minimized by measuring the remaining thickness of each film and, at a predetermined remaining film thickness, changes the etching condition to another condition.

Further, in the etching of a polysilicon of a gate electrode, measuring the remaining polysilicon thickness by the interference light from the device isolation portion can precisely determine when the remaining polysilicon thickness reaches the target thickness, thus preventing the underlying oxide film of the gate electrode portion from being overetched and minimizing the number of faulty wafer products.

In these embodiments described above, light of multiple wavelengths is radiated from the spectroscope having a light source to produce interference light by interference between rays of light reflected from the material being processed. The interference light is used to measure the thickness of the material being etched. It is also possible to use a spectroscope without a light source and use, as a light source, light of multiple wavelengths emitted from a plasma.

The present invention is further characterized by the following:

(1) An etching method which stores data measured while etching a sample, estimates an etch depth in the etching process by using the stored data, and stops the etching process at a predetermined etch depth.

(2) In etching an object material having no underlying film, an etching method which measures an amount of etch in a mask formed over the object material to be etched and a step height or distance from the upper surface of the mask to the bottom surface of the object material and thereby controls the etch depth of the object material.

(3) An etching method which estimates a remaining film thickness of a portion of the sample being etched by using the interference light data obtained during the process of sample etching and stops the etching at a predetermined remaining film thickness.

(4) In the damascene etching process, an etching method which estimates an initial film-thickness and determines a groove thickness by using interference light data obtained during the etching process and stops the etching at a predetermined groove depth.

(5) In etching a gate layer formed over an underlying film with a different in-plane thickness, an etching method which measures interference light from a thick portion of the underlying film to measure the remaining thickness of the gate layer formed over the thick portion of the underlying film, thereby controlling the thickness of the gate layer.

(6) In etching an object material consisting of a plurality of stacked films, an etching method which measures interference light from the object material and selects one of digital filters for each film to process interference light data, thereby controlling the thickness of each film.

(7) In BARC etching, an etching method which uses interference light from the material being etched to control the thickness of the BARC and thereby prevent a possible overetch of the underlying film.

(8) In the manufacture of semiconductor devices having STI portions, a semiconductor device manufacturing method which, when etching a polysilicon that forms a part of the semiconductor devices, controls the polysilicon etching by the remaining thickness of the polysilicon formed over the STI portion.

What is claimed is:

1. A method of measuring an etch quantity of a material being processed, comprising:

a) setting standard patterns ($P_S$) of time differential values of values relating to an interference light from a first material to be processed that respectively correspond to a plurality of predetermined etch quantities of the first material including a mask layer, the standard patterns using the wavelength as a parameter;

b) measuring values relating to an interference light of multiple wavelengths from a second material being processed of same structure as the first material and determining actual patterns of differential values of the measured values relating to the interference light, the actual patterns using the wavelength as a parameter;

c) determining an etch quantity of the second material based on the standard patterns of the first material and the actual patterns; and d) obtaining a time change value of the etch quantity of the second material based on the etch quantity of the second material at a first time point and the etch quantity of the second material at a second time point obtained in the c) operation.

2. A method according to claim 1, comprising:
obtaining an etch rate (|xa|) of the second material based on the time change value of the etch quantity of the second material obtained in the d) operation.

3. A method according to claim 1, comprising:
predicting an etch quantity of the second material based on the time change value of the etch quantity of the second material obtained in the d) operation.

4. A method according to claim 1, comprising:
an initial film thickness of the second material based on the time change value of the etch quantity of the second material obtained in the d) operation.

5. A method according to claim 1, comprising:
predicting an etch quantity of the second material based on the initial film thickness and the time change value of the etch quantity of the second material obtained in the d) operation.

6. A method according to claim 4, comprising:
comparing the initial film thickness with a predetermined value to determine a deposition state of the second material.

7. A method according to claim 1, comprising:
comparing the time change value of the etch quantity of the second material obtained in the d) operation with a predetermined value to determine a processing state of the second material.

8. A method of measuring an etch quantity of a material being processed, comprising:

a) setting standard patterns ($P_S$) of time differential values of values relating to an interference light from a first material to be processed that respectively correspond to a plurality of predetermined etch quantities of the first material including a mask layer, the standard patterns using the wavelength as a parameter;

b) measuring values relating to an interference light of multiple wavelengths from a second material being processed of same structure as the first material and determining actual patterns of differential values of the measured values relating to the interference light, the actual patterns using the wavelength as a parameter;

c) determining an etch quantity of the second material based on the standard patterns of the first material and the actual patterns; and d) obtaining a time change value of the etch quantity of the second material based on time series data of the etch quantities of the second material obtained in the c) operation.

9. A method according to claim 8, comprising:
obtaining an etch rate (|xa|) of the second material based on the time change value of the etch quantity of the second material obtained in the d) operation.

10. A method according to claim 8, comprising:
predicting an etch quantity of the second material based on the time change value of the etch quantity of the second material obtained in the d) operation.

11. A method according to claim 8, comprising:
an initial film thickness of the second material based on the time change value of the etch quantity of the second material obtained in the d) operation.

12. A method according to claim 11, comprising:
predicting an etch quantity of the second material based on the initial film thickness and the time change value of the etch quantity of the second material obtained in the d) operation.

13. A method according to claim 11, comprising:
comparing the initial film thickness with a predetermined value to determine a deposition state of the second material.

14. A method according to claim 8, comprising:
comparing the time change value of the etch quantity of the second material obtained in the d) operation with a predetermined value to determine a processing state of the second material.

15. A machine including one or more machine-readable medium containing at least one sequence of instructions that, when executed, at least partially cause the machine to effect a method of measuring an etch quantity of a material being processed, the method including:

a) setting standard patterns ($P_S$) of time differential values of values relating to an interference light from a first material to be processed that respectively correspond to a plurality of predetermined etch quantities of the first material including a mask layer, the standard patterns using the wavelength as a parameter;

b) measuring values relating to an interference light of multiple wavelengths from a second material being processed of same structure as the first material and determining actual patterns of differential values of the measured values relating to the interference light, the actual patterns using the wavelength as a parameter;

c) determining an etch quantity of the second material based on the standard patterns of the first material and the actual patterns; and d) obtaining a time change value of the etch quantity of the second material based on the etch quantity of the second material at a first time point and the etch quantity of the second material at a second time point obtained in the c) operation.

16. A machine according to claim 15, comprising the at least one sequence of instructions, when executed, at least partially causing the machine to effect:
obtaining an etch rate (|xa|) of the second material based on the time change value of the etch quantity of the second material obtained in the d) operation.

17. A machine according to claim 15, comprising the at least one sequence of instructions, when executed, at least partially causing the machine to effect:
predicting an etch quantity of the second material based on the time change value of the etch quantity of the second material obtained in the d) operation.

18. A machine according to claim 15, comprising the at least one sequence of instructions, when executed, at least partially causing the machine to effect:

an initial film thickness of the second material based on the time change value of the etch quantity of the second material obtained in the d) operation.

19. A machine according to claim 18, comprising the at least one sequence of instructions, when executed, at least partially causing the machine to effect:

predicting an etch quantity of the second material based on the initial film thickness and the time change value of the etch quantity of the second material obtained in the d) operation.

20. A machine according to claim 18, comprising the at least one sequence of instructions, when executed, at least partially causing the machine to effect:

comparing the initial film thickness with a predetermined value to determine a deposition state of the second material.

21. A machine according to claim 15, comprising the at least one sequence of instructions, when executed, at least partially causing the machine to effect:

comparing the time change value of the etch quantity of the second material obtained in the d) operation with a predetermined value to determine a processing state of the second material.

* * * * *